(12) United States Patent
Noyes et al.

(10) Patent No.: US 9,323,994 B2
(45) Date of Patent: Apr. 26, 2016

(54) MULTI-LEVEL HIERARCHICAL ROUTING MATRICES FOR PATTERN-RECOGNITION PROCESSORS

(75) Inventors: Harold B Noyes, Boise, ID (US); David R. Brown, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 1246 days.

(21) Appl. No.: 12/638,759

(22) Filed: Dec. 15, 2009

(65) Prior Publication Data
US 2011/0145544 A1 Jun. 16, 2011

(51) Int. Cl.
*G06F 9/02* (2006.01)
*G06F 13/00* (2006.01)
*G06F 19/24* (2011.01)
*G06K 9/00* (2006.01)
*G06F 17/30* (2006.01)

(52) U.S. Cl.
CPC ...... *G06K 9/00986* (2013.01); *G06F 17/30985* (2013.01)

(58) Field of Classification Search
CPC ............... G06F 17/30985; G06K 9/00986
USPC ............... 712/11, 220, 34, 36; 326/38, 39, 41
See application file for complete search history.

(56) References Cited

U.S. PATENT DOCUMENTS

| 5,300,830 | A | 4/1994 | Hawes |
| 5,331,227 | A | 7/1994 | Hawes |
| 5,818,254 | A * | 10/1998 | Agrawal et al. .................. 326/39 |
| 6,240,003 | B1 | 5/2001 | McElroy |
| 6,577,160 | B2 * | 6/2003 | Reddy et al. ..................... 326/41 |
| 6,880,087 | B1 | 4/2005 | Carter |
| 6,906,938 | B2 | 6/2005 | Kaginele |
| 6,944,710 | B2 | 9/2005 | Regev et al. |
| 7,089,352 | B2 | 8/2006 | Regev et al. |
| 7,146,643 | B2 | 12/2006 | Dapp et al. |
| 7,392,229 | B2 | 6/2008 | Harris et al. |
| 7,487,131 | B2 | 2/2009 | Harris et al. |
| 7,487,542 | B2 | 2/2009 | Boulanger |
| 7,774,286 | B1 | 8/2010 | Harris |
| 7,916,510 | B1 * | 3/2011 | Starovoitov et al. ......... 365/49.1 |
| 8,065,249 | B1 | 11/2011 | Harris |
| 2001/0041012 | A1 | 11/2001 | Hsieh et al. |
| 2007/0075878 | A1 | 4/2007 | Furodet et al. |
| 2007/0127482 | A1 * | 6/2007 | Harris et al. .................. 370/392 |
| 2007/0282833 | A1 | 12/2007 | McMillen et al. |

(Continued)

FOREIGN PATENT DOCUMENTS

CN 1559072 12/2004
JP 2006-018539 1/2006

OTHER PUBLICATIONS

Written Opinion for PCT/US2010/059310, pp. 1-9.*

(Continued)

*Primary Examiner* — Andrew Caldwell
*Assistant Examiner* — Yuqing Xiao
(74) *Attorney, Agent, or Firm* — Fletcher Yoder, P.C.

(57) ABSTRACT

Multi-level hierarchical routing matrices for pattern-recognition processors are provided. One such routing matrix may include one or more programmable and/or non-programmable connections in and between levels of the matrix. The connections may couple routing lines to feature cells, groups, rows, blocks, or any other arrangement of components of the pattern-recognition processor.

31 Claims, 18 Drawing Sheets

(56) References Cited

U.S. PATENT DOCUMENTS

| | | | |
|---|---|---|---|
| 2008/0265938 A1* | 10/2008 | Ting | 326/41 |
| 2011/0307433 A1 | 12/2011 | Dlugosch | |
| 2011/0307503 A1 | 12/2011 | Dlugosch | |
| 2012/0192163 A1 | 7/2012 | Glendenning | |
| 2012/0192164 A1 | 7/2012 | Xu | |
| 2012/0192165 A1 | 7/2012 | Xu | |
| 2012/0192166 A1 | 7/2012 | Xu | |

OTHER PUBLICATIONS

Sidhu et al., "A Self-Reconfigurable Gate Array Architecture", Aug. 2000, Proceedings of the The Roadmap to Reconfigurable Computing, 10th International Workshop on Field-Programmable Logic and Applications, pp. 106-120 (re-print pp. 1-14).*
Sidhu et atl., "String matching on multicontext FPGAs using self-reconfiguration", Feb. 1999, Proceedings of the 1999 ACM/SIGDA seventh international symposium on Field programmable gate arrays, pp. 217-226.*
European Patent Office, Office Action for Application No. 10 795 135.2-1901, PN804963EP. Apr. 17, 2015, 5 pages.*
Bird, S. et al.; One-Level Phonology: Autosegmental Representations and Rules as Finite Automata; Association for Computational Linguistics; University of Edinburgh; vol. 20; No. 1; pp. 55-90; 1994.
Clark, C.; Design of Efficient FPGA Circuits for Matching Complex Patterns in Network Intrusion Detection Systems (Master of Science Thesis); Georgia Institute of Technology; pp. 1-56; Dec. 2003.
Clark, C.; A Unified Model of Pattern-Matching Circuits for Field-Programmable Gate Arrays [Doctoral Dissertation]; Georgia Institute of Technology; pp. 1-177; 2006.
Clark, C. et al.; Scalable Pattern Matching for High Speed Networks; Proceedings of the $12^{th}$ Annual IEEE symposium on Field-Programmable Custom Computing Machines (FCCM'04);Georgia Institute of Technology; pp. 1-9; 2004.
Fide, S.; String Processing in Hardware; Scalable Parallel and Distributed Systems Lab; Proceedings of the $12^{th}$ Annual IEEE symposium on Field-Programmable Custom Computing Machines (FCCM'04);School of Electrical and Computer Engineering; Georgia Institute of Technology; pp. 1-9; 2004.
Kumar, S. et al.; Curing Regular Expressions matching Algorithms from Insomnia, Amnesia, and Acaluia; Department of Computer Science and Engineering; Washington University in St. Louis; pp. 1-17; Apr. 27, 2007.
Lipovski, G.; Dynamic Systolic Associative Memory Chip; IEEE; Department of Electrical and Computer Engineering; University of Texas at Austin; pp. 481-492; 1990.
Lin, C. et al.; Optimization of Pattern Matching Circuits for Regular Expression on FPGA; IEEE Transactions on Very Large Scale Integrations Systems; vol. 15, No. 12, pp. 1-6; Dec. 2007.
Schultz, K. et al.; Fully Parallel Integrated CAM/RAM Using Preclassification to Enable Large Capacities; IEEE Journal on Solid-State Circuits; vol. 31; No. 5; pp. 689-699; May 1996.
Shafai, F. et al.; Fully Parallel 30-MHz, 2.5-Mb CAM; IEEE Journal of Solid-State Circuits, vol. 33; No. 11; pp. 1690-1696; Nov. 1998.
Wada, T.; Multiobject Behavior Recognition Event Driven Selective Attention Method; IEEE; pp. 1-16; 2000.
Yu, F.; High Speed Deep Packet Inspection with Hardware Support; Electrical Engineering and Computer Sciences; University of California at Berkeley; pp. 1-217; Nov. 22, 2006.
Freescale and Kaspersky® Accelerated Antivirus Solution Platform for OEM Vendors; Freescale Semiconductors Document; pp. 1-16; 2007.
Noyes, et al., U.S. Appl. No. 12/253,966, filed Oct. 18, 2008, "System and Method of Indirect Register Access".
Noyes, et al., U.S. Appl. No. 12/253,967, filed Oct. 18, 2008, "Indirect Register Access Method and System".
Noyes, U.S. Appl. No. 12/265,421, filed Nov. 5, 2008, "Methods and Systems to Accomplish Variable Width Data Input".
Noyes, et al., U.S. Appl. No. 12/265,436, filed Nov. 5, 2008, "Bus Translator".
Noyes, U.S. Appl. No. 12/265,465, filed Nov. 5, 2008, "Pattern-Recognition Processor with Results Buffer".
Noyes, et al., U.S. Appl. No. 12/268,270, filed Nov. 10, 2008, "Methods and Systems for Directly Connecting Devices to Microcontrollers".
Noyes, U.S. Appl. No. 12/325,875, filed Dec. 1, 2008, "Systems and Methods for Managing Endian Mode of a Device".
Noyes, U.S. Appl. No. 12/325,982, filed Dec. 1, 2008, "Systems and Methods to Enable Identification of Different Data Sets".
Noyes, U.S. Appl. No. 12/325,986, filed Dec. 1, 2008, "Devices, Systems, and Methods to Synchronize Simultaneous DMA Parallel Processing of a Single Data Stream by Multiple Devices".
Noyes, U.S. Appl. No. 12/325,990, filed Dec. 1, 2008, "Devices, Systems, and Methods to Synchronize Parallel Processing of a Single Data Stream".
Noyes, U.S. Appl. No. 12/347,403, filed Dec. 31, 2008, "Systems, Methods, and Devices for Configuring a Device".
Pawlowski, U.S. Appl. No. 12/350,132, filed Jan. 7, 2009, "Pattern-Recognition Processor with Matching-Data Reporting Module".
Pawlowski, U.S. Appl. No. 12,350,136, filed Jan. 7, 2009, "Buses for Pattern-Recognition Processors".
Pawlowski, U.S. Appl. No. 12/350,142, filed Jan. 7, 2009, "Methods and Systems for Power Consumption Management of a Pattern-Recognition Processor".
Noyes, U.S. Appl. No. 12/352,311, filed Jan. 12, 2009, "Devices, Systems, and Methods for Communicating Pattern Matching Results of a Parallel Pattern Search Engine".
Noyes, U.S. Appl. No. 12/492,824, filed Jun. 26, 2009, "Methods and Devices for Saving and/or Restoring a State of a Pattern-Recognition Processor".
Harris, U.S. Appl. No. 60/652,738, filed Feb. 12, 2005, "Means and Mechanism for Finding Meaningful Information in Databases or Data Sets by Topical Content Patterns at Speeds Exceeding Conventional Computers".
Moscola J et al; Implementation of Network Application Layer Parser for Multiple TCP/IP Flows in Reconfigurable Devices; Department of Computer Science and Engineering Washington University, St. Louis, MO, 2006, pp. 1-4.
Anomynous; Field-Programmable Gate Array; Wikipedia, the free encyclopedia; Jun. 9, 2011, pp. 1-11; XP055000431, Retrieved from the Internet.
Christopher R. Clark et al; Efficient Reconfigurable Logic Circuits for Matching Complex Network Intrusion Detection Patterns; 2003, School of Electrical and Computer Engineering, Georgia Institute of Technology, Atlanta, Georgia, vol. 2778, pp. 956-959.
Cheng-Hung Lin et al; Optimization of Pattern Matching Circuits for Regular Expression on FPGA; Piscataway, NJ, USA, vol. 12, Dec. 1, 2007, pp. 1303-1310.
Joao Bispo; Regular Expression Matching for Reconfigurable Packet Inspection; Field Programmable Technology, 2006. FPT 2006. Dec. 1, 2006, pp. 119-126.
Abhishek Mitra et al; Compiling PCRE to FPGA for Accelerating SNORT IDS; Department of Computer Science and Engineering University of California, Riverside; Dec. 3, 2007, pp. 127-135.
Anurag Tiwari et al; Saving Power by Mapping Finite-State Machines into Embedded Memory Blocks in FPGAs; Department of ECECS, University of Cincinnati, USA; Feb. 16-20, 2004, vol. 2, pp. 916-921.
Beesley, K. R.; Arabic Morphology Using Only Finite-State Operations; Xerox Research Centre Europe; (1998) pp. 50-57.
Bispo, J. et al.; Regular Expression Matching for Reconfigurable Packet Inspection; IEEE (2006) pp. 119-126.
Bispo, J. et al.; Synthesis of Regular Expressions Targeting FPGAs: Current Status and Open Issues; IST/INESC-ID, Libson, Portugal; (2007) pp. 179-190.
Brodie, B. et al.; A scalable Architecture for High-Throughput Regular-Expression Pattern Matching; Exegy Inc.; pp. (2006) pp. 191-202.
Clark, C. et al.; A Unified Model of Pattern-Matching Circuit Architectures; Tech Report GIT-CERCS-05-20; Georgia Institute of Technology; pp. 1-17; www.cercs.gatech.edu/tech-reports/tr2005/git-cercs-05-20.pdf•PDF file1 A Unified Model of Pattern-Matching

(56) References Cited

OTHER PUBLICATIONS

Circuit Architectures Tech Report GIT-CERCS-05-20 Christopher R. Clark and David E. Schimmel Center for Experimental . . . I (2005).
Fisk, M. et al.; Applying Fast String Matching to Intrusion Detection; Los Alamos National Laboratory; University of California San Diego; (2001) pp. 1-21.
Korenek, J.; Traffic Scanner-Hardware Accelerated Intrusion Detection System; http://www.liberouter.org/ ; (2006) pp. 1-7.
Korenek, J.; Traffic Scanner-Hardware Accelerated Intrusion Detection System; http://www.liberouter.org/ ; (2007) pp. 1-23.
Sidhu, R. et al.; Fast Regular Expression Pattern Matching using FPGAs; Department of EE-Systems; University of Southern California; (2001) pp. 1-12.
Hurson A. R.; VLSI Design for the Parallel Finite State Automation and Its Performance Evaluation as a Hardware Scanner; International Journal of Computer and Information Sciences, vol. 13, No. 6. (1984); pp. 491-508.
Chinese Office Action dated Jan. 27, 2014.
Taiwan Office Action issued Nov. 4, 2013.
Japanese Office Action dated Apr. 10, 2014 and translation.

* cited by examiner

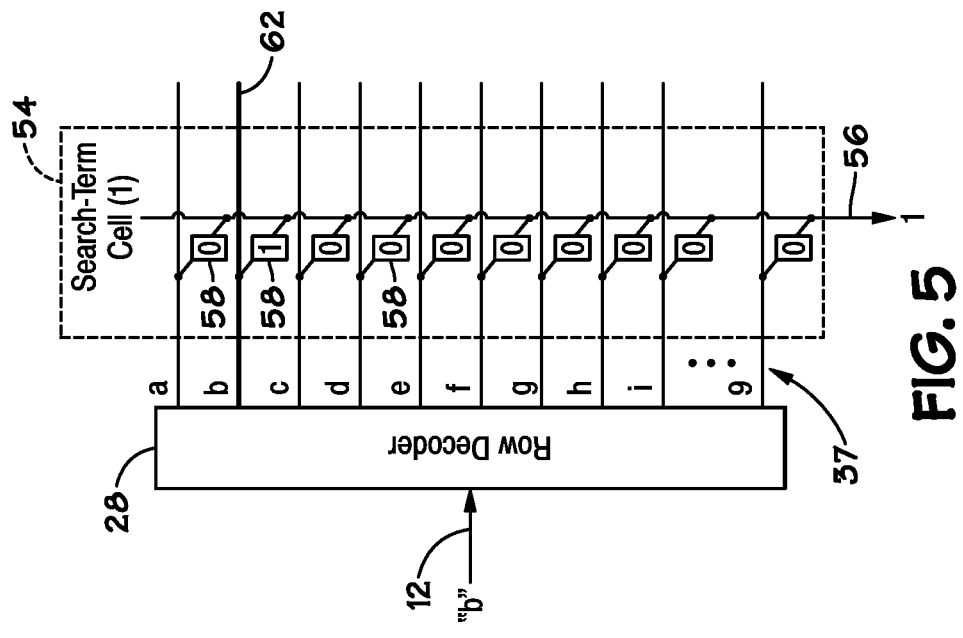
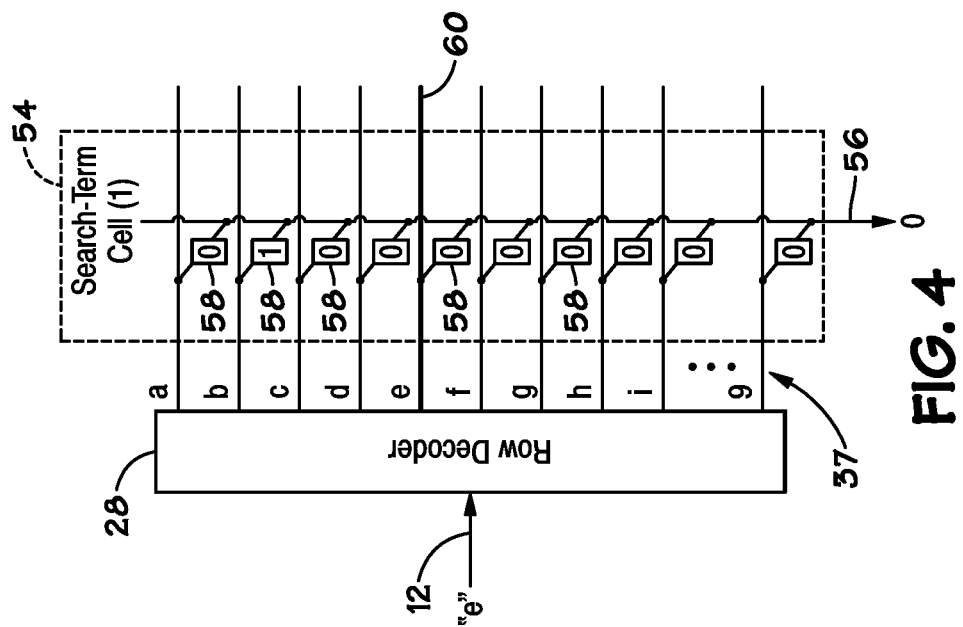

MULTI-LEVEL HIERARCHICAL ROUTING MATRICES FOR PATTERN-RECOGNITION PROCESSORS

BACKGROUND

1. Field of Invention

Embodiments of the invention relate generally to pattern-recognition processors and, more specifically, in certain embodiments, to connection architectures of such processors.

2. Description of Related Art

In the field of computing, pattern recognition tasks are increasingly challenging. Ever larger volumes of data are transmitted between computers, and the number of patterns that users wish to identify is increasing. For example, spam or malware are often detected by searching for patterns in a data stream, e.g., particular phrases or pieces of code. The number of patterns increases with the variety of spam and malware, as new patterns may be implemented to search for new variants. Searching a data stream for each of these patterns can form a computing bottleneck. Often, as the data stream is received, it is searched for each pattern, one at a time. The delay before the system is ready to search the next portion of the data stream increases with the number of patterns. Thus, pattern recognition may slow the receipt of data.

Such patter-recognition processors may include a large number of finite state machines (FSM) that move from state to state as inputs are processed. Internal connections of conventional processors rely on physical wires connected to a flip-fop or other memory element. However, such connections may be incapable of meeting the performance for a pattern-search processor. Further, such connections are generally not configurable or capable of meeting a desired functionality. The distance, speed, and configurability of the connections in a pattern-recognition processor may be challenging to implement in silicon.

BRIEF DESCRIPTION OF DRAWINGS

FIGS. 4 and 5 depict the search-term cell of FIG. 3 searching the data stream for a single character;

DETAILED DESCRIPTION

Figure 1:
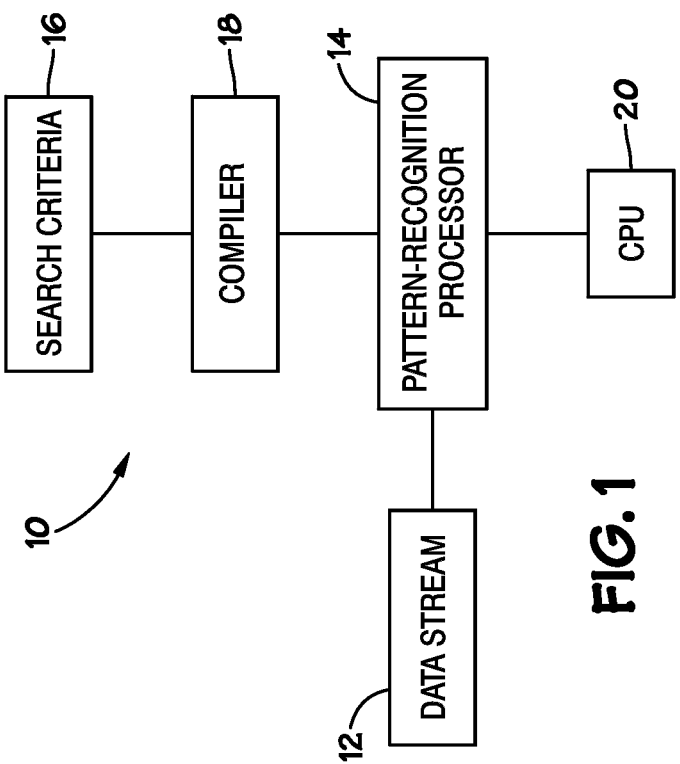
FIG. 1 depicts an example of system that searches a data stream.

FIG. 1 depicts an example of a system 10 that searches a data stream 12. The system 10 may include a pattern-recognition processor 14 that searches the data stream 12 according to search criteria 16.

Each search criterion may specify one or more target expressions, i.e., patterns. The phrase "target expression" refers to a sequence of data for which the pattern-recognition processor 14 is searching. Examples of target expressions include a sequence of characters that spell a certain word, a sequence of genetic base pairs that specify a gene, a sequence of bits in a picture or video file that form a portion of an image, a sequence of bits in an executable file that form a part of a program, or a sequence of bits in an audio file that form a part of a song or a spoken phrase.

A search criterion may specify more than one target expression. For example, a search criterion may specify all five-letter words beginning with the sequence of letters "cl", any word beginning with the sequence of letters "cl", a paragraph that includes the word "cloud" more than three times, etc. The number of possible sets of target expressions is arbitrarily large, e.g., there may be as many target expressions as there are permutations of data that the data stream could present. The search criteria may be expressed in a variety of formats, including as regular expressions, a programming language that concisely specifies sets of target expressions without necessarily listing each target expression.

Each search criterion may be constructed from one or more search terms. Thus, each target expression of a search criterion may include one or more search terms and some target expressions may use common search terms. As used herein, the phrase "search term" refers to a sequence of data that is searched for, during a single search cycle. The sequence of data may include multiple bits of data in a binary format or other formats, e.g., base ten, ASCII, etc. The sequence may encode the data with a single digit or multiple digits, e.g., several binary digits. For example, the pattern-recognition processor 14 may search a text data stream 12 one character at a time, and the search terms may specify a set of single characters, e.g., the letter "a", either the letters "a" or "e", or a wildcard search term that specifies a set of all single characters.

Search terms may be smaller or larger than the number of bits that specify a character (or other grapheme—i.e., fundamental unit—of the information expressed by the data stream, e.g., a musical note, a genetic base pair, a base-10 digit, or a sub-pixel). For instance, a search term may be 8 bits and a single character may be 16 bits, in which case two consecutive search terms may specify a single character.

The search criteria 16 may be formatted for the pattern-recognition processor 14 by a compiler 18. Formatting may include deconstructing search terms from the search criteria. For example, if the graphemes expressed by the data stream 12 are larger than the search terms, the compiler may deconstruct the search criterion into multiple search terms to search for a single grapheme. Similarly, if the graphemes expressed by the data stream 12 are smaller than the search terms, the compiler 18 may provide a single search term, with unused bits, for each separate grapheme. The compiler 18 may also format the search criteria 16 to support various regular expressions operators that are not natively supported by the pattern-recognition processor 14.

The pattern-recognition processor 14 may search the data stream 12 by evaluating each new term from the data stream 12. The word "term" here refers to the amount of data that could match a search term. During a search cycle, the pattern-recognition processor 14 may determine whether the currently presented term matches the current search term in the search criterion. If the term matches the search term, the evaluation is "advanced", i.e., the next term is compared to the next search term in the search criterion. If the term does not match, the next term is compared to the first term in the search criterion, thereby resetting the search.

Each search criterion may be compiled into a different finite state machine (FSM) in the pattern-recognition processor 14. The finite state machines may run in parallel, searching the data stream 12 according to the search criteria 16. The finite state machines may step through each successive search term in a search criterion as the preceding search term is matched by the data stream 12, or if the search term is unmatched, the finite state machines may begin searching for the first search term of the search criterion.

The pattern-recognition processor 14 may evaluate each new term according to several search criteria, and their respective search terms, at about the same time, e.g., during a single device cycle. The parallel finite state machines may each receive the term from the data stream 12 at about the same time, and each of the parallel finite state machines may determine whether the term advances the parallel finite state machine to the next search term in its search criterion. The parallel finite state machines may evaluate terms according to a relatively large number of search criteria, e.g., more than 100, more than 1000, or more than 10,000. Because they operate in parallel, they may apply the search criteria to a data stream 12 having a relatively high bandwidth, e.g., a data stream 12 of greater than or generally equal to 64 MB per second or 128 MB per second, without slowing the data stream. In some embodiments, the search-cycle duration does not scale with the number of search criteria, so the number of search criteria may have little to no effect on the performance of the pattern-recognition processor 14.

When a search criterion is satisfied (i.e., after advancing to the last search term and matching it), the pattern-recognition processor 14 may report the satisfaction of the criterion to a processing unit, such as a central processing unit (CPU) 20. The central processing unit 20 may control the pattern-recognition processor 14 and other portions of the system 10.

The system 10 may be any of a variety of systems or devices that search a stream of data. For example, the system 10 may be a desktop, laptop, handheld or other type of computer that searches the data stream 12. The system 10 may also be a network node, such as a router, a server, or a client (e.g., one of the previously-described types of computers). The system 10 may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The data stream 12 may be one or more of a variety of types of data streams that a user or other entity might wish to search. For example, the data stream 12 may be a stream of data received over a network, such as packets received over the Internet or voice or data received over a cellular network. The data stream 12 may be data received from a sensor in communication with the system 10, such as an imaging sensor, a temperature sensor, an accelerometer, or the like, or combinations thereof. The data stream 12 may be received by the system 10 as a serial data stream, in which the data is received in an order that has meaning, such as in a temporally, lexically, or semantically significant order. Or the data stream 12 may be received in parallel or out of order and, then, converted into a serial data stream, e.g., by reordering packets received over the Internet. In some embodiments, the data stream 12 may present terms serially, but the bits expressing each of the terms may be received in parallel. The data stream 12 may be received from a source external to the system 10, or may be formed by interrogating a memory device and forming the data stream 12 from stored data.

Depending on the type of data in the data stream 12, different types of search criteria may be chosen by a designer. For instance, the search criteria 16 may be a virus definition file. Viruses or other malware may be characterized, and aspects of the malware may be used to form search criteria that indicate whether the data stream 12 is likely delivering malware. The resulting search criteria may be stored on a server, and an operator of a client system may subscribe to a service that downloads the search criteria to the system 10. The search criteria 16 may be periodically updated from the server as different types of malware emerge. The search criteria may also be used to specify undesirable content that might be received over a network, for instance unwanted emails (commonly known as spam) or other content that a user finds objectionable.

The data stream 12 may be searched by a third party with an interest in the data being received by the system 10. For example, the data stream 12 may be searched for text, a sequence of audio, or a sequence of video that occurs in a copyrighted work. The data stream 12 may be searched for utterances that are relevant to a criminal investigation or civil proceeding or are of interest to an employer. In other embodiments, monitoring a data stream for data of interest may be an example of searching.

The search criteria 16 may also include patterns in the data stream 12 for which a translation is available, e.g., in memory addressable by the CPU 20 or the pattern-recognition processor 14. For instance, the search criteria 16 may each specify an English word for which a corresponding Spanish word is stored in memory. In another example, the search criteria 16 may specify encoded versions of the data stream 12, e.g., MP3, MPEG 4, FLAC, Ogg Vorbis, etc., for which a decoded version of the data stream 12 is available, or vice versa.

The pattern-recognition processor 14 may be hardware that is integrated with the CPU 20 into a single component (such as a single device) or may be formed as a separate component. For instance, the pattern-recognition processor 14 may be a separate integrated circuit. The pattern-recognition processor 14 may be referred to as a "co-processor" or a "pattern-recognition co-processor".

Figure 2:
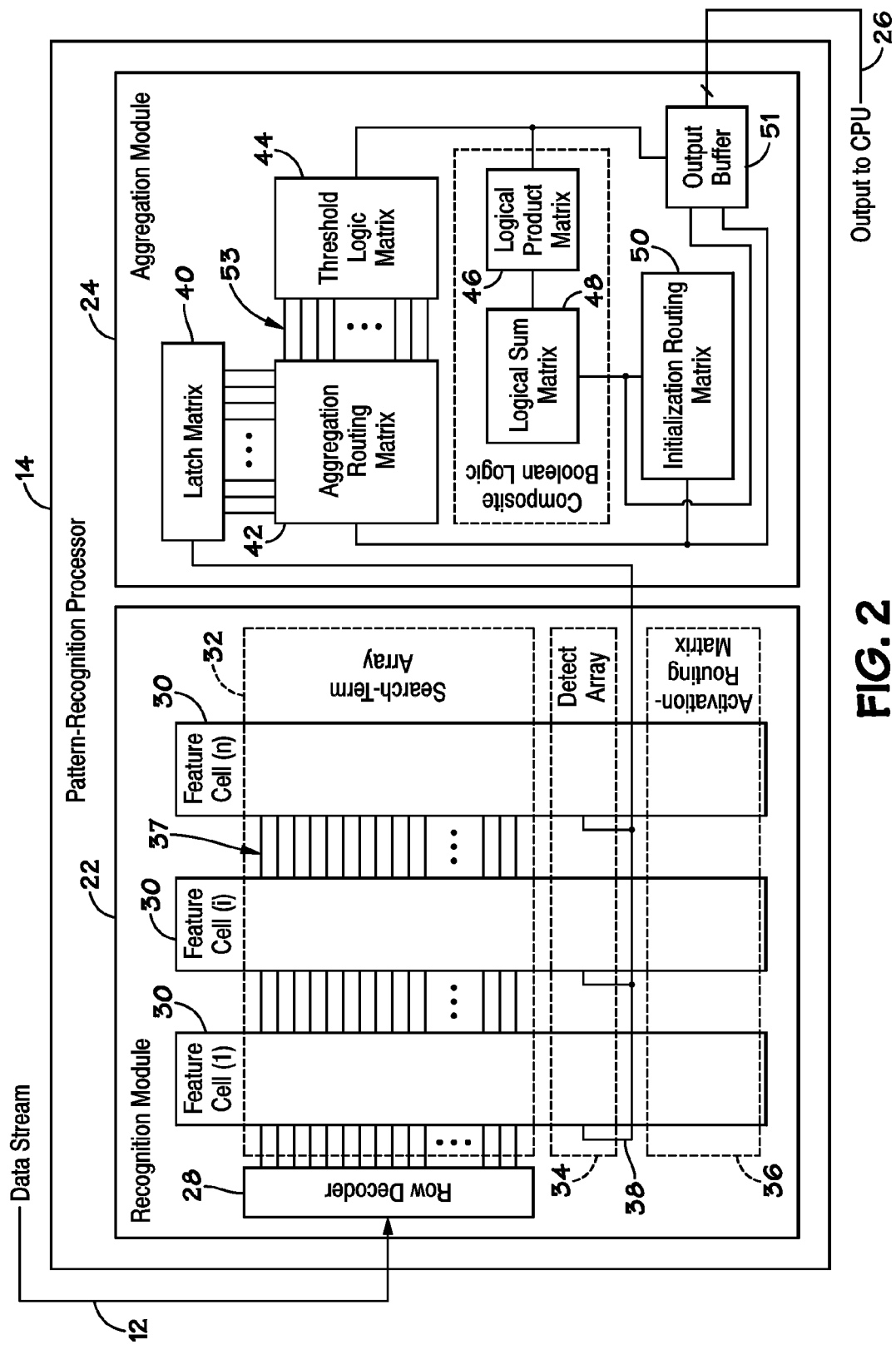
FIG. 2 depicts an example of a pattern-recognition processor in the system of FIG. 1.

FIG. 2 depicts an example of the pattern-recognition processor 14. The pattern-recognition processor 14 may include a recognition module 22 and an aggregation module 24. The recognition module 22 may be configured to compare received terms to search terms, and both the recognition module 22 and the aggregation module 24 may cooperate to determine whether matching a term with a search term satisfies a search criterion.

The recognition module 22 may include a row decoder 28 and a plurality of feature cells 30. Each feature cell 30 may specify a search term, and groups of feature cells 30 may form a parallel finite state machine that forms a search criterion. Components of the feature cells 30 may form a search-term array 32, a detection array 34, and an activation-routing matrix 36. The search-term array 32 may include a plurality of input conductors 37, each of which may place each of the feature cells 30 in communication with the row decoder 28.

The row decoder 28 may select particular conductors among the plurality of input conductors 37 based on the content of the data stream 12. For example, the row decoder 28 may be a one byte to 256 row decoder that activates one of 256 rows based on the value of a received byte, which may represent one term. A one-byte term of 0000 0000 may correspond to the top row among the plurality of input conductors 37, and a one-byte term of 1111 1111 may correspond to the bottom row among the plurality of input conductors 37. Thus, different input conductors 37 may be selected, depending on which terms are received from the data stream 12. As different terms are received, the row decoder 28 may deactivate the row corresponding to the previous term and activate the row corresponding to the new term.

The detection array 34 may couple to a detection bus 38 that outputs signals indicative of complete or partial satisfaction of search criteria to the aggregation module 24. The activation-routing matrix 36 may selectively activate and deactivate feature cells 30 based on, for example, the number of search terms in a search criterion that have been matched.

The aggregation module 24 may include a latch matrix 40, an aggregation-routing matrix 42, a threshold-logic matrix 44, a logical-product matrix 46, a logical-sum matrix 48, and an initialization-routing matrix 50.

The latch matrix 40 may implement portions of certain search criteria. Some search criteria, e.g., some regular expressions, count only the first occurrence of a match or group of matches. The latch matrix 40 may include latches that record whether a match has occurred. The latches may be cleared during initialization, and periodically re-initialized during operation, as search criteria are determined to be satisfied or not further satisfiable—i.e., an earlier search term may need to be matched again before the search criterion could be satisfied.

The aggregation-routing matrix 42 may function similar to the activation-routing matrix 36. The aggregation-routing matrix 42 may receive signals indicative of matches on the detection bus 38 and may route the signals to different group-logic lines 53 connecting to the threshold-logic matrix 44. The aggregation-routing matrix 42 may also route outputs of the initialization-routing matrix 50 to the detection array 34 to reset portions of the detection array 34 when a search criterion is determined to be satisfied or not further satisfiable.

The threshold-logic matrix 44 may include a plurality of counters, e.g., 32-bit counters configured to count up or down. The threshold-logic matrix 44 may be loaded with an initial count, and it may count up or down from the count based on matches signaled by the recognition module. For instance, the threshold-logic matrix 44 may count the number of occurrences of a word in some length of text.

The outputs of the threshold-logic matrix 44 may be inputs to the logical-product matrix 46. The logical-product matrix 46 may selectively generate "product" results (e.g., "AND" function in Boolean logic). The logical-product matrix 46 may be implemented as a square matrix, in which the number of output products is equal the number of input lines from the threshold-logic matrix 44, or the logical-product matrix 46 may have a different number of inputs than outputs. The resulting product values may be output to the logical-sum matrix 48.

The logical-sum matrix 48 may selectively generate sums (e.g., "OR" functions in Boolean logic.) The logical-sum matrix 48 may also be a square matrix, or the logical-sum matrix 48 may have a different number of inputs than outputs. Since the inputs are logical products, the outputs of the logical-sum matrix 48 may be logical-Sums-of-Products (e.g., Boolean logic Sum-of-Product (SOP) form). The output of the logical-sum matrix 48 may be received by the initialization-routing matrix 50.

The initialization-routing matrix 50 may reset portions of the detection array 34 and the aggregation module 24 via the aggregation-routing matrix 42. The initialization-routing matrix 50 may also be implemented as a square matrix, or the initialization-routing matrix 50 may have a different number of inputs than outputs. The initialization-routing matrix 50 may respond to signals from the logical-sum matrix 48 and re-initialize other portions of the pattern-recognition processor 14, such as when a search criterion is satisfied or determined to be not further satisfiable.

The aggregation module 24 may include an output buffer 51 that receives the outputs of the threshold-logic matrix 44, the aggregation-routing matrix 42, and the logical-sum matrix 48. The output of the aggregation module 24 may be transmitted from the output buffer 51 to the CPU 20 (FIG. 1) on the output bus 26. In some embodiments, an output multiplexer may multiplex signals from these components 42, 44, and 48 and output signals indicative of satisfaction of criteria or matches of search terms to the CPU 20 (FIG. 1). In other embodiments, results from the pattern-recognition processor 14 may be reported without transmitting the signals through the output multiplexer, which is not to suggest that any other feature described herein could not also be omitted. For example, signals from the threshold-logic matrix 44, the logical-product matrix 46, the logical-sum matrix 48, or the initialization routing matrix 50 may be transmitted to the CPU in parallel on the output bus 26.

Figure 3:
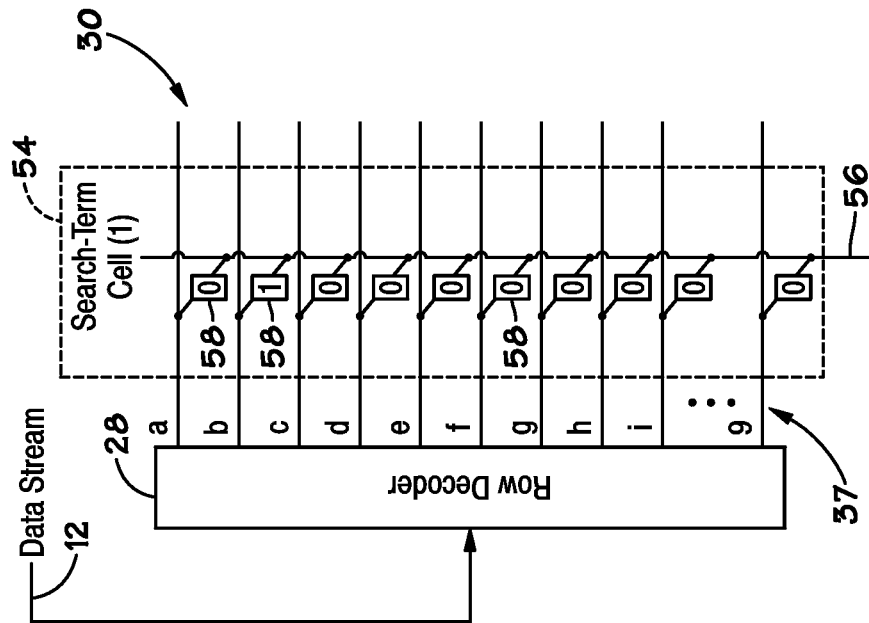
FIG. 3 depicts an example of a search-term cell in the pattern-recognition processor of FIG. 2.

FIG. 3 illustrates a portion of a single feature cell 30 in the search-term array 32 (FIG. 2), a component referred to herein as a search-term cell 54. The search-term cells 54 may include an output conductor 56 and a plurality of memory cells 58. Each of the memory cells 58 may be coupled to both the output conductor 56 and one of the conductors among the plurality of input conductors 37. In response to its input conductor 37 being selected, each of the memory cells 58 may output a value indicative of its stored value, outputting the data through the output conductor 56. In some embodiments, the plurality of input conductors 37 may be referred to as "word lines", and the output conductor 56 may be referred to as a "data line".

The memory cells 58 may include any of a variety of types of memory cells. For example, the memory cells 58 may be volatile memory, such as dynamic random access memory (DRAM) cells having a transistor and a capacitor. The source and the drain of the transistor may be connected to a plate of the capacitor and the output conductor 56, respectively, and the gate of the transistor may be connected to one of the input conductors 37. In another example of volatile memory, each of the memory cells 58 may include a static random access memory (SRAM) cell. The SRAM cell may have an output that is selectively coupled to the output conductor 56 by an access transistor controlled by one of the input conductors 37. The memory cells 58 may also include nonvolatile memory, such as phase-change memory (e.g., an ovonic device), flash memory, silicon-oxide-nitride-oxide-silicon (SONOS) memory, magneto-resistive memory, or other types of nonvolatile memory. The memory cells 58 may also include flip-flops, e.g., memory cells made out of logic gates.

FIGS. 4 and 5 depict an example of the search-term cell 54 in operation. FIG. 4 illustrates the search-term cell 54 receiving a term that does not match the cell's search term, and FIG. 5 illustrates a match.

As illustrated by FIG. 4, the search-term cell 54 may be configured to search for one or more terms by storing data in the memory cells 58. The memory cells 58 may each represent a term that the data stream 12 might present, e.g., in FIG. 3, each memory cell 58 represents a single letter or number, starting with the letter "a" and ending with the number "9". Memory cells 58 representing terms that satisfy the search term may be programmed to store a first value, and memory cells 58 that do not represent terms that satisfy the search term may be programmed to store a different value. In the illustrated example, the search-term cell 54 is configured to search for the letter "b". The memory cells 58 that represent "b" may store a 1, or logic high, and the memory cells 58 that do not represent "b" may be programmed to store a 0, or logic low.

To compare a term from the data stream 12 with the search term, the row decoder 28 may select the input conductor 37 coupled to memory cells 58 representing the received term. In FIG. 4, the data stream 12 presents a lowercase "e". This term may be presented by the data stream 12 in the form of an eight-bit ASCII code, and the row decoder 28 may interpret this byte as a row address, outputting a signal on the conductor 60 by energizing it.

In response, the memory cell 58 controlled by the conductor 60 may output a signal indicative of the data that the memory cell 58 stores, and the signal may be conveyed by the output conductor 56. In this case, because the letter "e" is not one of the terms specified by the search-term cell 54, it does not match the search term, and the search-term cell 54 outputs a 0 value, indicating no match was found.

In FIG. 5, the data stream 12 presents a character "b". Again, the row decoder 28 may interpret this term as an address, and the row decoder 28 may select the conductor 62. In response, the memory cell 58 representing the letter "b" outputs its stored value, which in this case is a 1, indicating a match.

The search-term cells 54 may be configured to search for more than one term at a time. Multiple memory cells 58 may be programmed to store a 1, specifying a search term that matches with more than one term. For instance, the memory cells 58 representing the letters lowercase "a" and uppercase "A" may be programmed to store a 1, and the search-term cell 54 may search for either term. In another example, the search-term cell 54 may be configured to output a match if any character is received. All of the memory cells 58 may be programmed to store a 1, such that the search-term cell 54 may function as a wildcard term in a search criterion.

Figure 6:
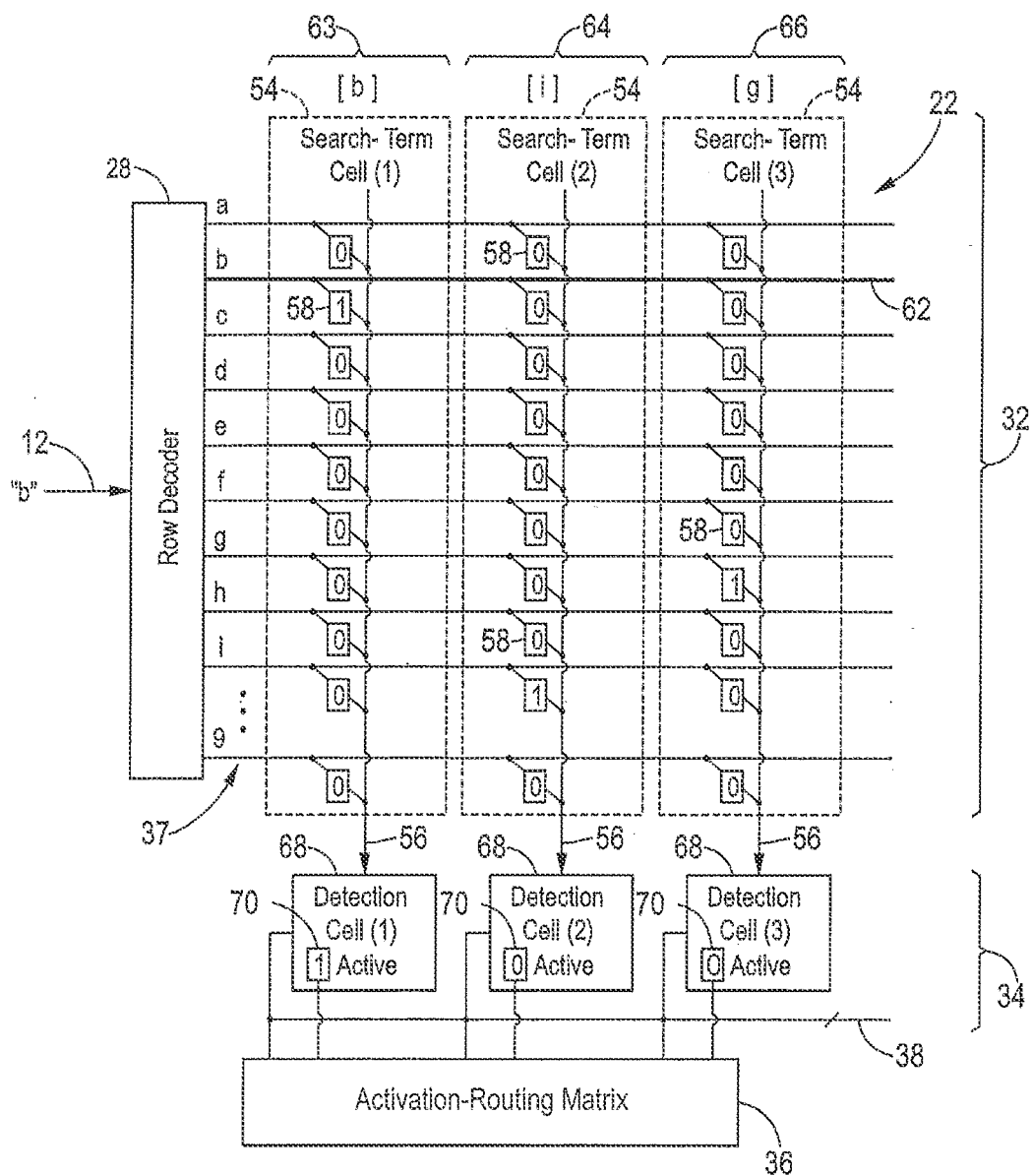
FIGS. 6-8 depict a recognition module including several search-term cells searching the data stream for a word.
Figure 7:
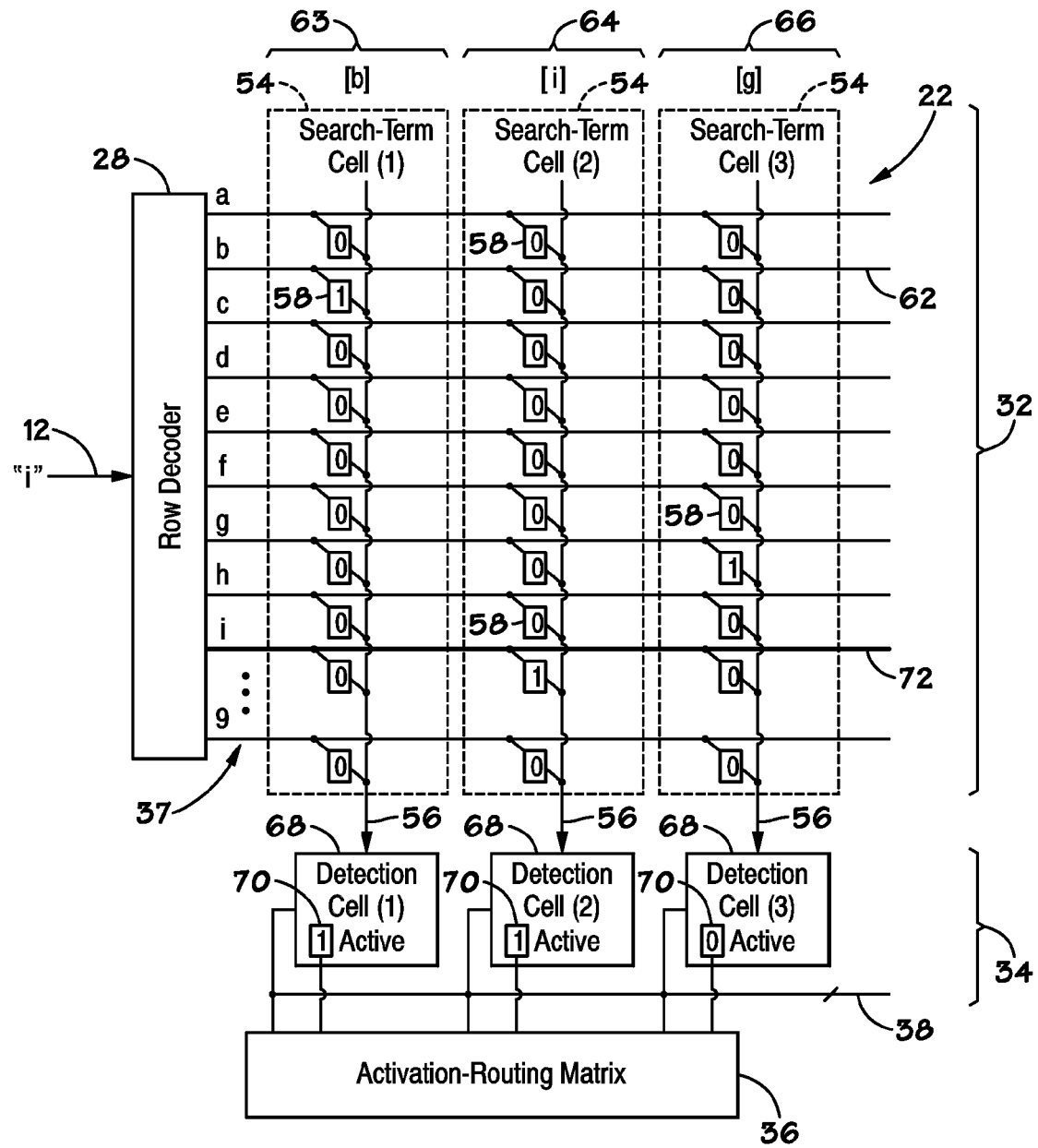
Figure 8:
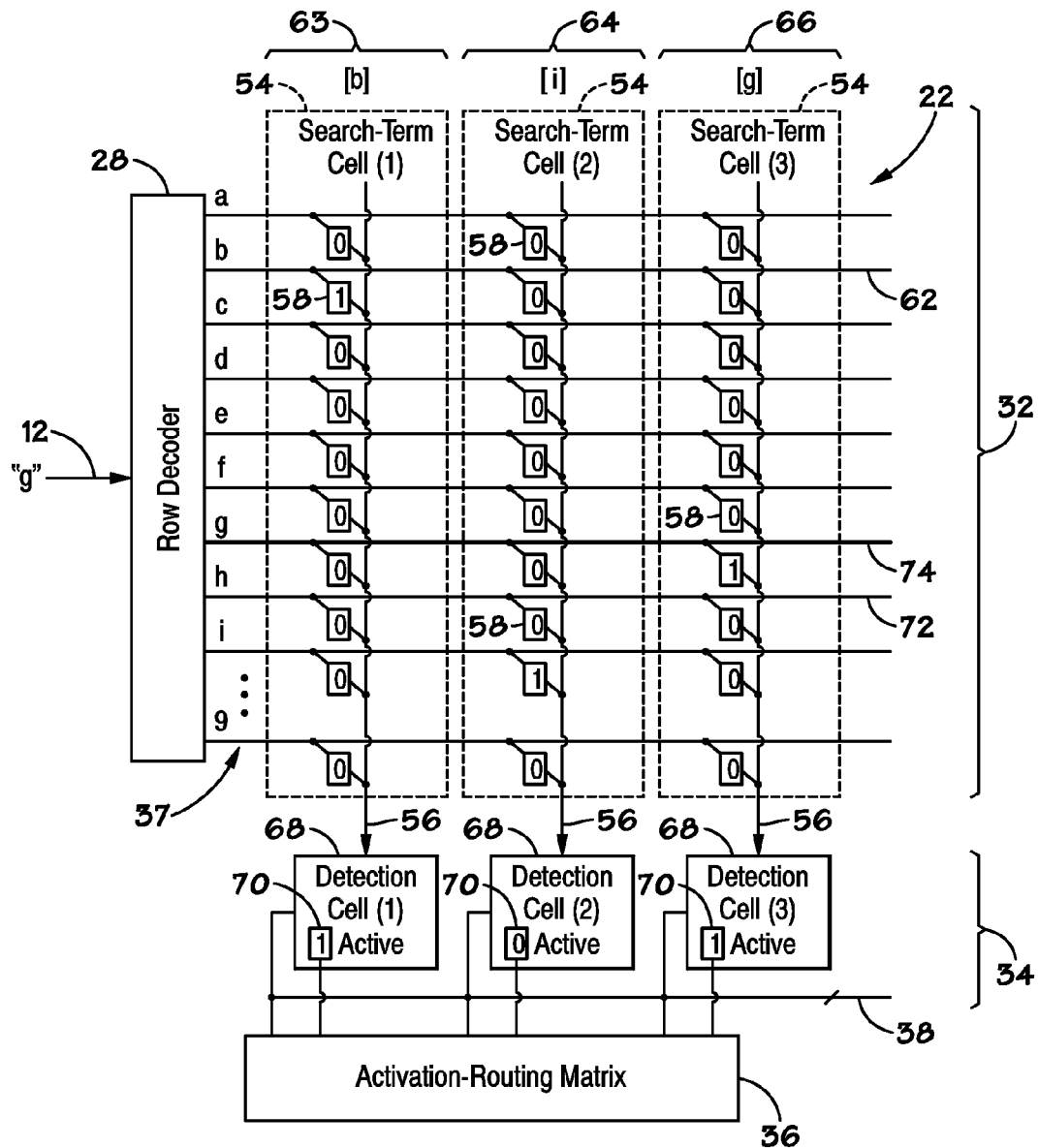

FIGS. 6-8 depict the recognition module 22 searching according to a multi-term search criterion, e.g., for a word. Specifically, FIG. 6 illustrates the recognition module 22 detecting the first letter of a word, FIG. 7 illustrates detection of the second letter, and FIG. 8 illustrates detection of the last letter.

As illustrated by FIG. 6, the recognition module 22 may be configured to search for the word "big". Three adjacent feature cells 63, 64, and 66 are illustrated. The feature cell 63 is configured to detect the letter "b". The feature cell 64 is configured to detect the letter "i". And the feature cell 66 is configured to both detect the letter "g" and indicate that the search criterion is satisfied.

FIG. 6 also depicts additional details of the detection array 34. The detection array 34 may include a detection cell 68 in each of the feature cells 63, 64, and 66. Each of the detection cells 68 may include a memory cell 70, such as one of the types of memory cells described above (e.g., a flip-flop), that indicates whether the feature cell 63, 64, or 66 is active or inactive. The detection cells 68 may be configured to output a signal to the activation-routing matrix 36 indicating whether the detection cell both is active and has received a signal from its associated search-term cell 54 indicating a match. Inactive features cells 63, 64, and 66 may disregard matches. Each of the detection cells 68 may include an AND gate with inputs from the memory cell 70 and the output conductor 56. The output of the AND gate may be routed to both the detection bus 38 and the activation-routing matrix 36, or one or the other.

The activation-routing matrix 36, in turn, may selectively activate the feature cells 63, 64, and 66 by writing to the memory cells 70 in the detection array 34. The activation-routing matrix 36 may activate feature cells 63, 64, or 66 according to the search criterion and which search term is being searched for next in the data stream 12.

In FIG. 6, the data stream 12 presents the letter "b". In response, each of the feature cells 63, 64, and 66 may output a signal on their output conductor 56, indicating the value stored in the memory cell 58 connected to the conductor 62, which represents the letter "b". The detection cells 56 may then each determine whether they have received a signal indicating a match and whether they are active. Because the feature cell 63 is configured to detect the letter "b" and is active, as indicated by its memory cell 70, the detection cell 68 in the feature cell 63 may output a signal to the activation-routing matrix 36 indicating that the first search term of the search criterion has been matched.

As illustrated by FIG. 7, after the first search term is matched, the activation-routing matrix 36 may activate the next feature cell 64 by writing a 1 to its memory cell 70 in its detection cell 68. The activation-routing matrix 36 may also maintain the active state of the feature cell 63, in case the next term satisfies the first search term, e.g., if the sequence of terms "bbig" is received. The first search term of search criteria may be maintained in an active state during a portion or substantially all of the time during which the data stream 12 is searched.

In FIG. 7, the data stream 12 presents the letter "i" to the recognition module 22. In response, each of the feature cells 63, 64, and 66 may output a signal on their output conductor 56, indicating the value stored in the memory cell 58 connected to the conductor 72, which represents the letter "i". The detection cells 56 may then each determine whether they have received a signal indicating a match and whether they are active. Because the feature cell 64 is configured to detect the letter "i" and is active, as indicated by its memory cell 70, the detection cell 68 in the feature cell 64 may output a signal to the activation-routing matrix 36 indicating that the next search term of its search criterion has been matched.

Next, the activation-routing matrix 36 may activate the feature cell 66, as illustrated by FIG. 8. Before evaluating the next term, the feature cell 64 may be deactivated. The feature cell 64 may be deactivated by its detection cell 68 resetting its memory cell 70 between detection cycles or the activation-routing matrix 36 may deactivate the feature cell 64, for example.

In FIG. 8, the data stream 12 presents the term "g" to the row decoder 28, which selects the conductor 74 representing the term "g". In response, each of the feature cells 63, 64, and 66 may output a signal on their output conductor 56, indicating the value stored in the memory cell 58 connected to the conductor 74, which represents the letter "g". The detection cells 56 may then each determine whether they have received a signal indicating a match and whether they are active. Because the feature cell 66 is configured to detect the letter "g" and is active, as indicated by its memory cell 70, the detection cell 68 in the feature cell 66 may output a signal to the activation routing matrix 36 indicating that the last search term of its search criterion has been matched.

The end of a search criterion or a portion of a search criterion may be identified by the activation-routing matrix 36 or the detection cell 68. These components 36 or 68 may include memory indicating whether their feature cell 63, 64, or 66 specifies the last search term of a search criterion or a component of a search criterion. For example, a search criterion may specify all sentences in which the word "cattle" occurs twice, and the recognition module may output a signal indicating each occurrence of "cattle" within a sentence to the aggregation module, which may count the occurrences to determine whether the search criterion is satisfied.

Feature cells 63, 64, or 66 may be activated under several conditions. A feature cell 63, 64, or 66 may be "always active", meaning that it remains active during all or substantially all of a search. An example of an always active feature cell 63, 64, or 66 is the first feature cell of the search criterion, e.g., feature cell 63.

A feature cell 63, 64, or 66 may be "active when requested", meaning that the feature cell 63, 64, or 66 is active when some condition precedent is matched, e.g., when the preceding search terms in a search criterion are matched. An example is the feature cell 64, which is active when requested by the feature cell 63 in FIGS. 6-8, and the feature cell 66, which active when requested by the feature cell 64.

A feature cell 63, 64, or 66 may be "self activated", meaning that once it is activated, it activates itself as long as its search term is matched. For example, a self activated feature cell having a search term that is matched by any numerical digit may remain active through the sequence "123456xy" until the letter "x" is reached. Each time the search term of the self activated feature cell is matched, it may activate the next feature cell in the search criterion. Thus, an always active feature cell may be formed from a self activating feature cell and an active when requested feature cell: the self activating feature cell may be programmed with all of its memory cells 58 storing a 1, and it may repeatedly activate the active when requested feature cell after each term. In some embodiments, each feature cell 63, 64, and 66 may include a memory cell in its detection cell 68 or in the activation-routing matrix 36 that specifies whether the feature cell is always active, thereby forming an always active feature cell from a single feature cell.

Figure 9:
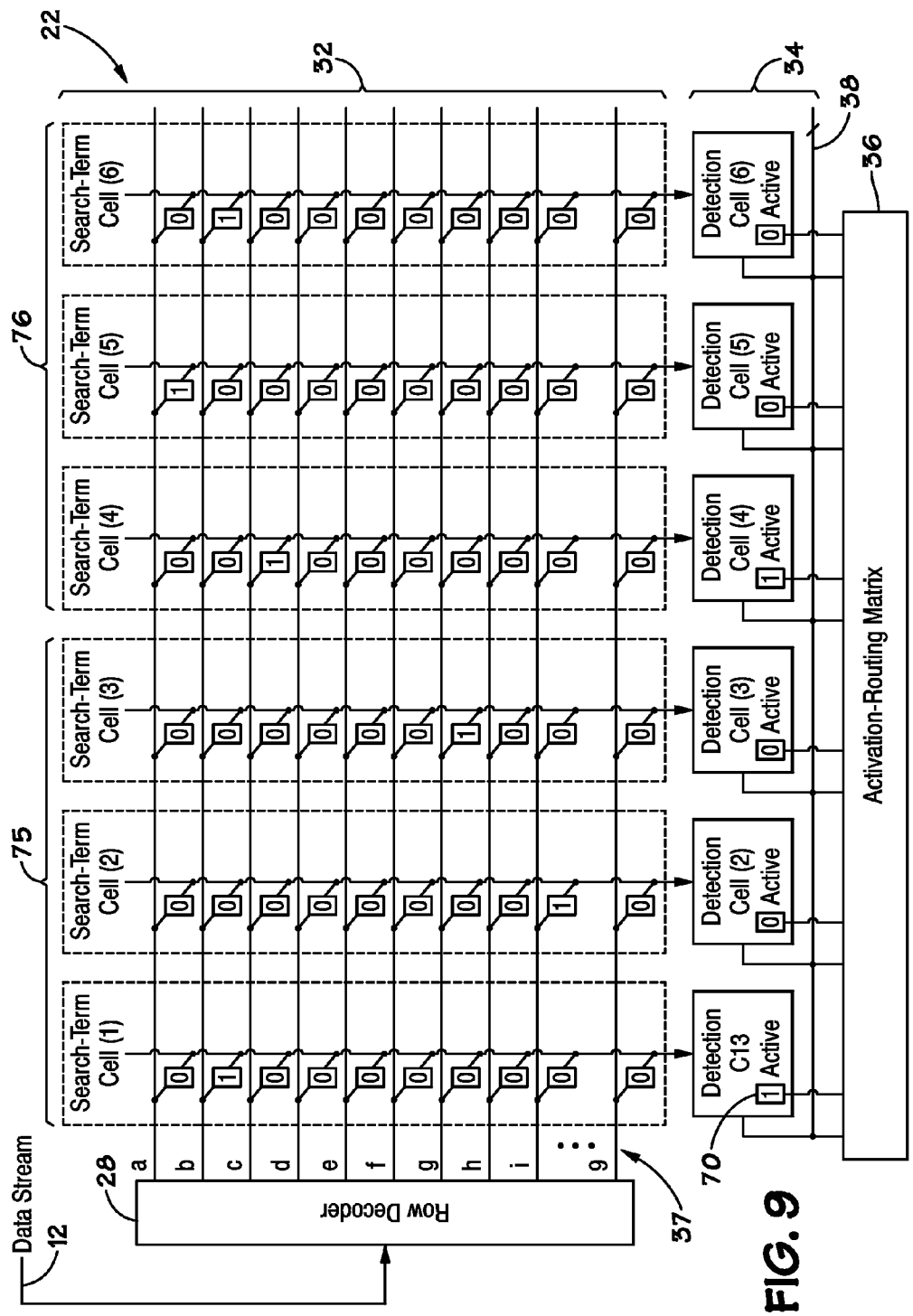
FIG. 9 depicts the recognition module configured to search the data stream for two words in parallel.

FIG. 9 depicts an example of a recognition module 22 configured to search according to a first search criterion 75 and a second search criterion 76 in parallel. In this example, the first search criterion 75 specifies the word "big", and the second search criterion 76 specifies the word "cab". A signal indicative of the current term from the data stream 12 may be communicated to feature cells in each search criterion 75 and 76 at generally the same time. Each of the input conductors 37 spans both of the search criteria 75 and 76. As a result, in some embodiments, both of the search criteria 75 and 76 may evaluate the current term generally simultaneously. This is believed to speed the evaluation of search criteria. Other embodiments may include more feature cells configured to evaluate more search criteria in parallel. For example, some embodiments may include more than 100, 500, 1000, 5000, or 10,000 feature cells operating in parallel. These feature cells may evaluate hundreds or thousands of search criteria generally simultaneously.

Search criteria with different numbers of search terms may be formed by allocating more or fewer feature cells to the search criteria. Simple search criteria may consume fewer resources in the form of feature cells than complex search criteria. This is believed to reduce the cost of the pattern-recognition processor 14 (FIG. 2) relative to processors with a large number of generally identical cores, all configured to evaluate complex search criteria.

Figure 10:
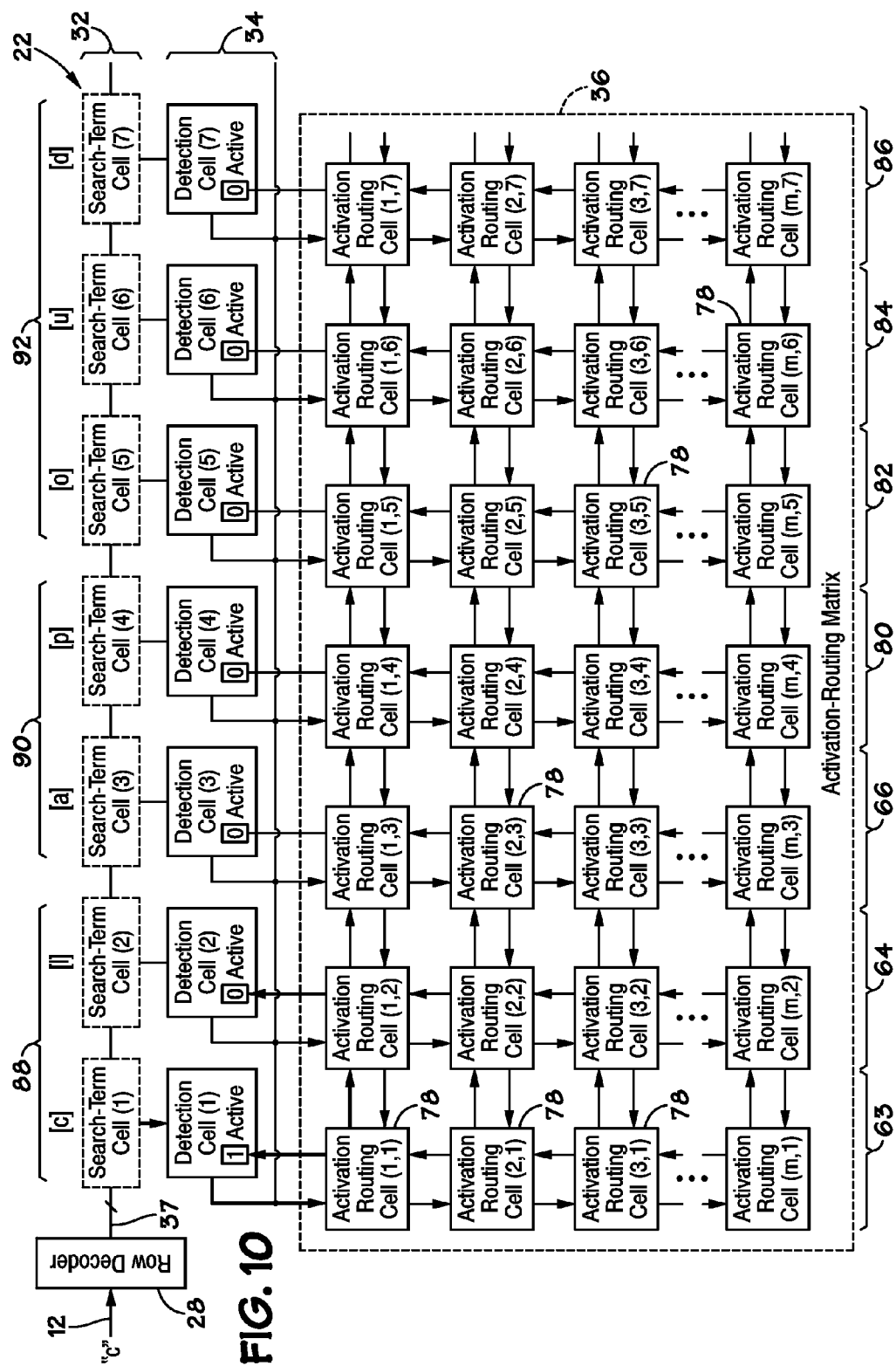
FIGS. 10-12 depict the recognition module searching according to a search criterion that specifies multiple words with the same prefix.
Figure 11:
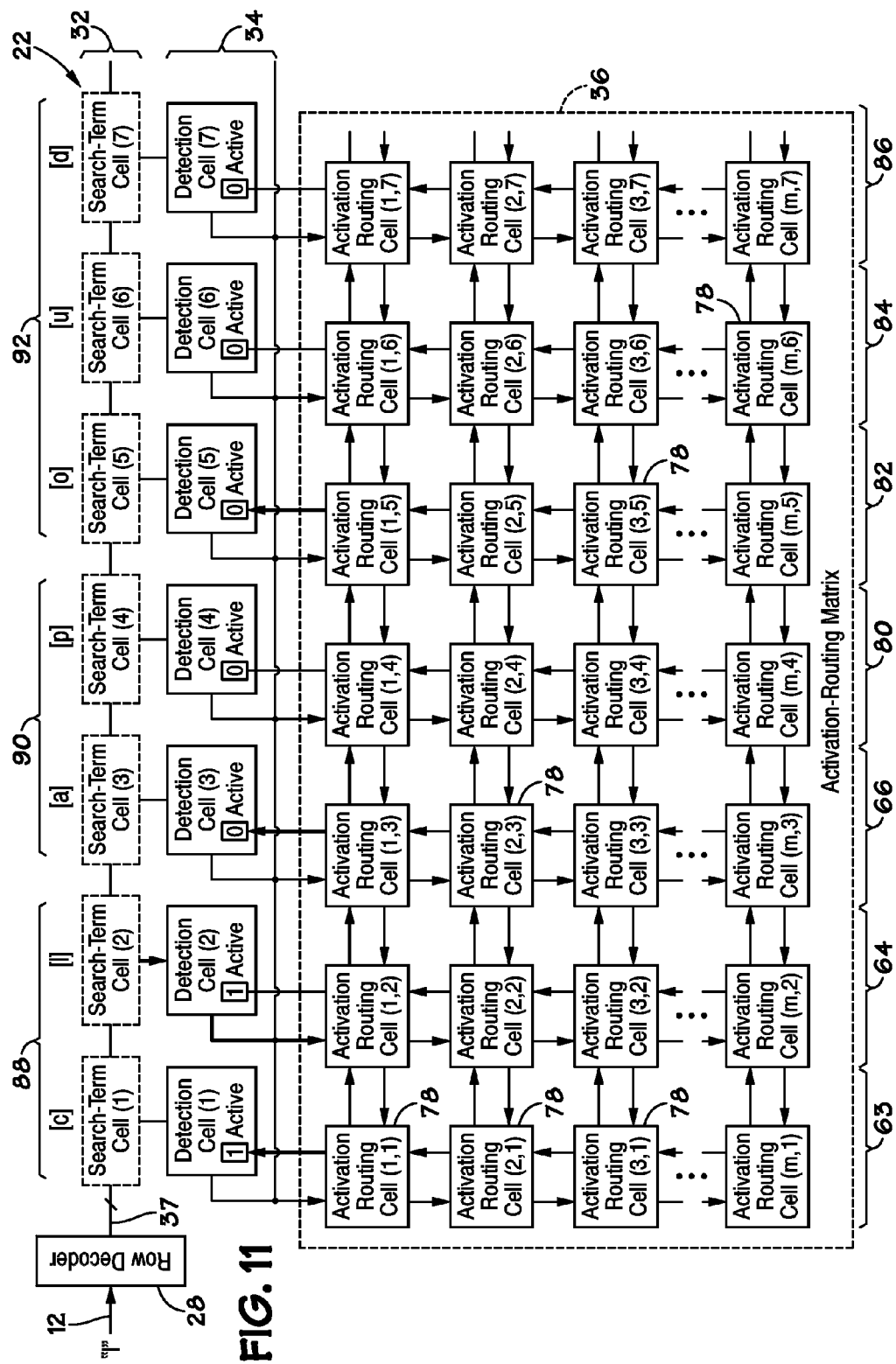
Figure 12:
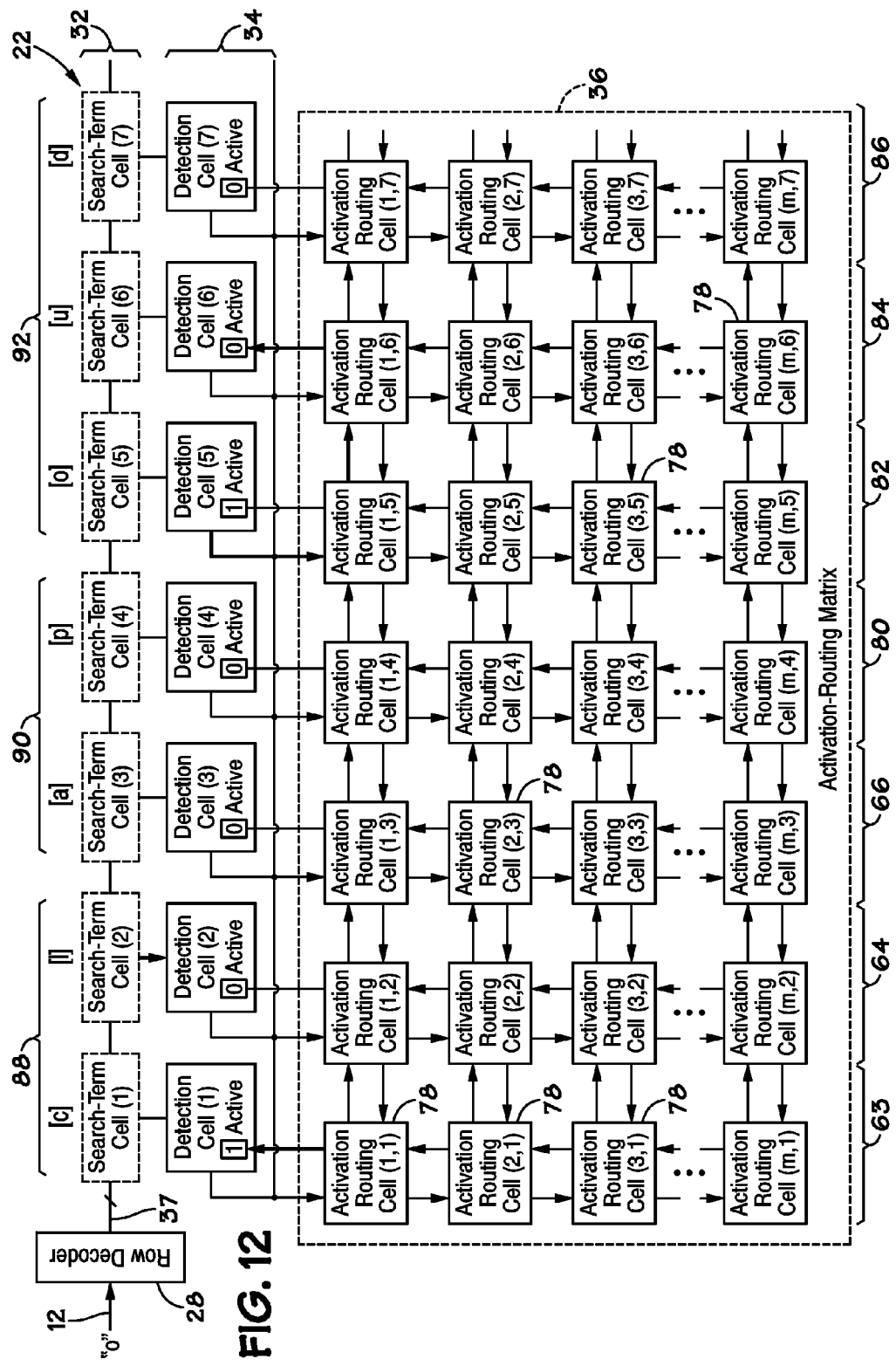

FIGS. 10-12 depict both an example of a more complex search criterion and features of the activation-routing matrix 36. The activation-routing matrix 36 may include a plurality of activation-routing cells 78, groups of which may be associated with each of the feature cells 63, 64, 66, 80, 82, 84, and 86. For instance, each of the feature cells may include 5, 10, 20, 50, or more activation-routing cells 78. The activation-routing cells 78 may be configured to transmit activation signals to the next search term in a search criterion when a preceding search term is matched. The activation-routing cells 78 may be configured to route activation signals to adjacent feature cells or other activation-routing cells 78 within the same feature cell. The activation-routing cells 78 may include memory that indicates which feature cells correspond to the next search term in a search criterion.

As illustrated by FIGS. 10-12, the recognition module 22 may be configured to search according to complex search criteria than criteria that specify single words. For instance, the recognition module 22 may be configured to search for words beginning with a prefix 88 and ending with one of two suffixes 90 or 92. The illustrated search criterion specifies words beginning with the letters "c" and "1" in sequence and ending with either the sequence of letters "ap" or the sequence of letters "oud". This is an example of a search criterion specifying multiple target expressions, e.g., the word "clap" or the word "cloud".

In FIG. 10, the data stream 12 presents the letter "c" to the recognition module 22, and feature cell 63 is both active and detects a match. In response, the activation-routing matrix 36 may activate the next feature cell 64. The activation-routing matrix 36 may also maintain the active state of the feature cell 63, as the feature cell 63 is the first search term in the search criterion.

In FIG. 11, the data stream 12 presents a letter "1", and the feature cell 64 recognizes a match and is active. In response, the activation-routing matrix 36 may transmit an activation signal both to the first feature cell 66 of the first suffix 90 and to the first feature cell 82 of the second suffix 92. In other examples, more suffixes may be activated, or multiple prefixes may active one or more suffixes.

Next, as illustrated by FIG. 12, the data stream 12 presents the letter "o" to the recognition module 22, and the feature cell 82 of the second suffix 92 detects a match and is active. In response, the activation-routing matrix 36 may activate the next feature cell 84 of the second suffix 92. The search for the first suffix 90 may die out, as the feature cell 66 is allowed to go inactive. The steps illustrated by FIGS. 10-12 may continue through the letters "u" and "d", or the search may die out until the next time the prefix 88 is matched.

Figure 13:
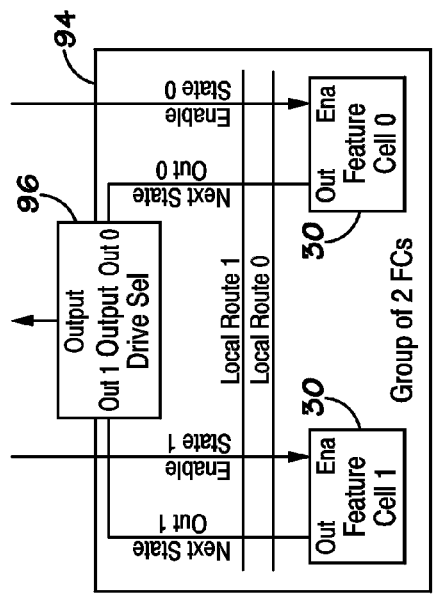
FIGS. 13-16 depict a hierarchical arrangement of feature cells of a pattern-recognition processor in accordance with an embodiment of the present invention.

Embodiments of the pattern recognition processor 14 may include any arrangement of feature cells 30. FIGS. 13-16 depict a hierarchical arrangement of feature cells 30 in accordance with an embodiment of the present invention. In one embodiment, as depicted in FIG. 13, a first level of a hierarchy may include the feature cells 30 arranged in groups 94 of two feature cells 30, Feature Cell 1 and Feature Cell 0. Each feature cell 30 may receive an input, e.g., an Enable State signal, and may output a Next State signal to another group of feature cells. Each feature cell 30 in the group 94 may be coupled to an output drive select 96 that provides an output from the group 94 based on the outputs of each feature cell 30. For example, in one embodiment, the output drive select 96 may be configured to output a Next State Out "0" signal, a Next State Out "1" signal, or the logical OR of the two Next State Out signals received from the feature cells 30.

Figure 14:
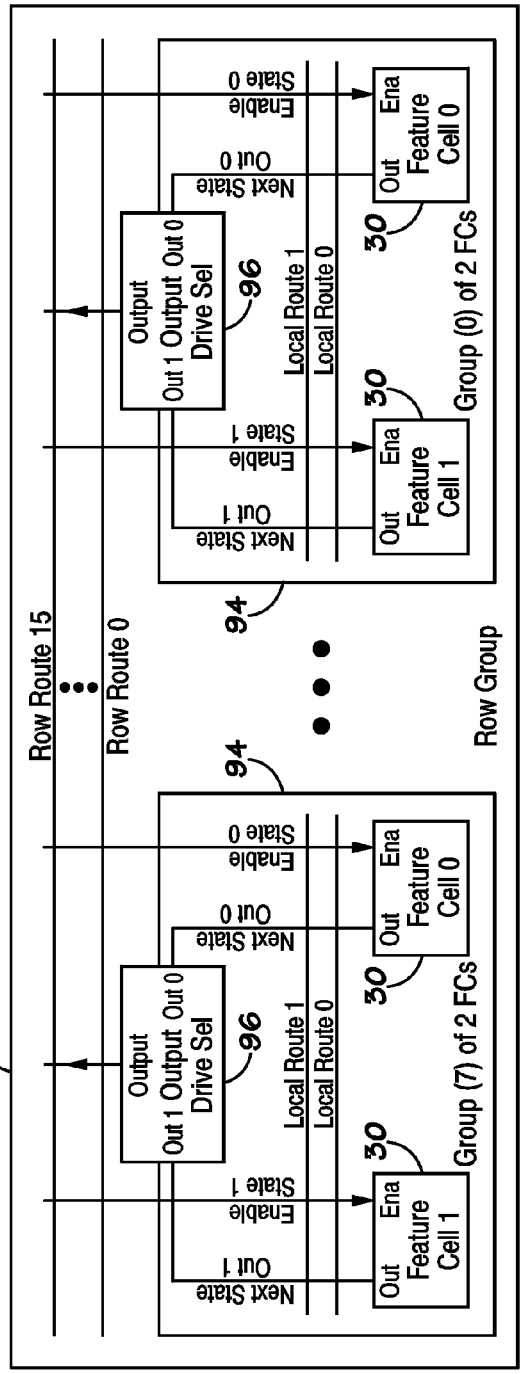

As shown in FIG. 14, a second hierarchical level may include each group 94 of feature cells arranged in a row 98 of groups 94. Each row 98 may include any number of groups 94 of feature cells 30. For example, in the embodiment shown in FIG. 14, the row 98 may include eight groups 94 of two feature cells 30, e.g. Group 0 through Group 7.

Figure 15:
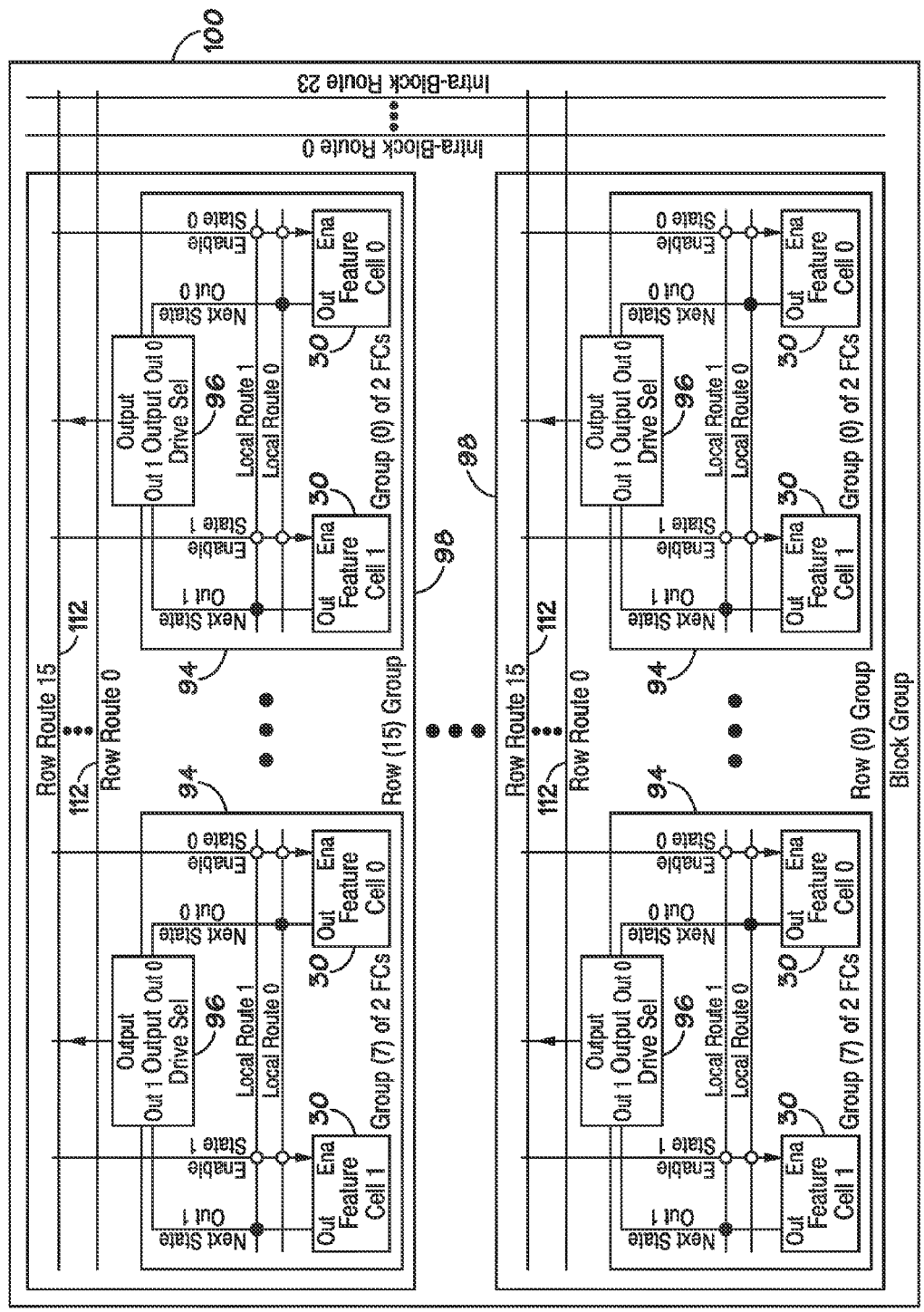
Figure 16:
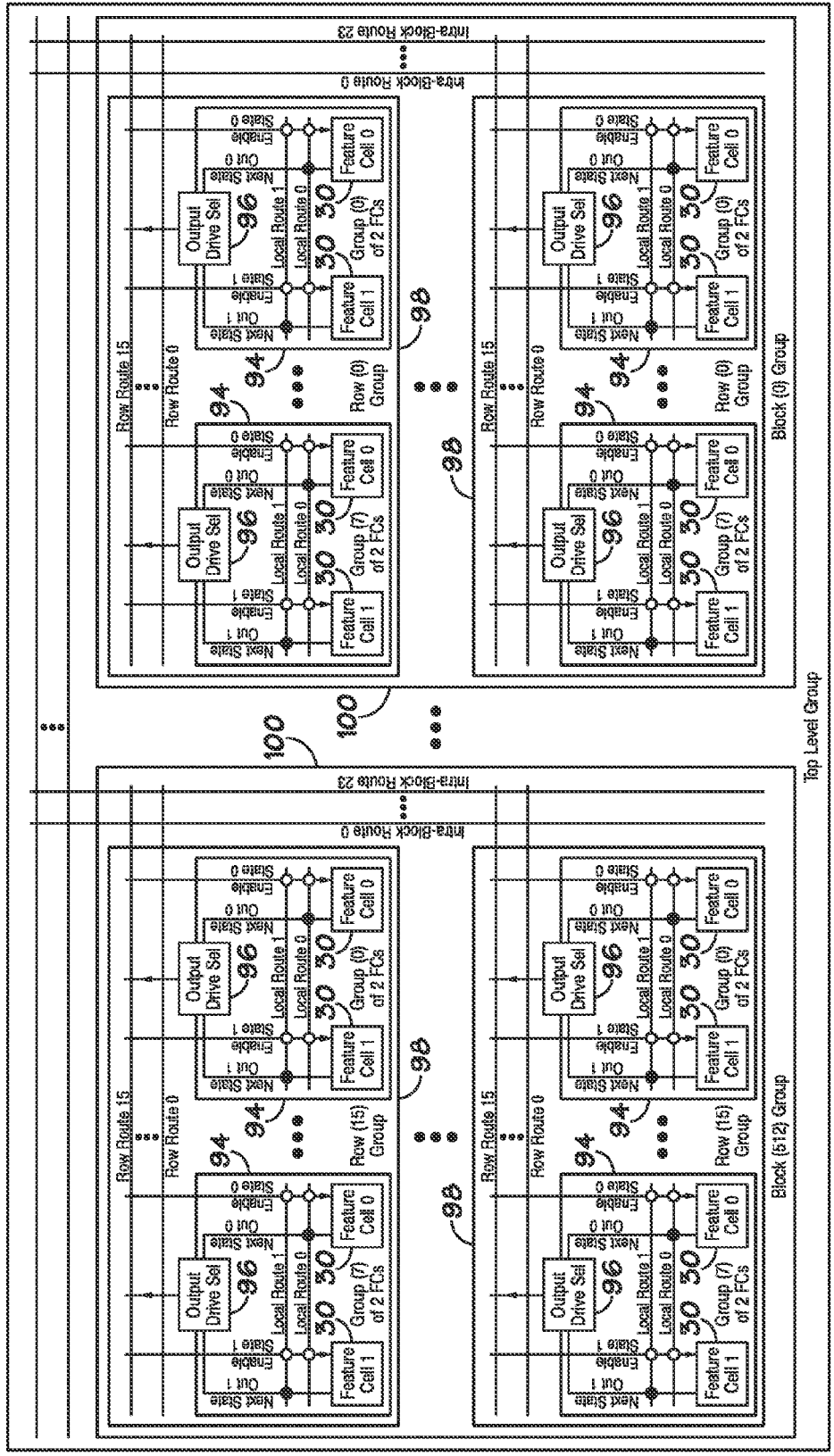

As shown in FIG. 15, a third level of a hierarchy may include multiple rows 98 grouped into blocks 100, wherein each block 100 includes one or more rows 98. In one embodiment of the processor 14, each block 100 may include 16 rows 98, e.g., Row 0 through Row 15. The pattern-recognition processor 14 may then include any number of blocks 100 for implementing the programmed state machines and pattern searching described above. As shown in FIG. 16, in one embodiment the pattern-recognition processor 14 may include 512 blocks, e.g., Block 0 through Block 512.

The groups 94, rows 98, and blocks 100 illustrated above describe a hierarchical arrangement of the feature cells. A programmed state machine may include any number of feature cells 30. Thus, each group, row, or block may include multiple programmed state machines. During operation of the pattern-recognition processer 14, such as during the search cycle described above, each state of a programmed state machine (e.g., one or more feature cells) is routed to the next state of the programmed state machine (referred to as "next state routing"), by the Next State signals output from each feature cell 30 and selected by the output drive select 96 of each group 94.

FIGS. 17-21 describe a multi-level hierarchical routing matrix that provides next state routing, programmability, and high throughput, in accordance with an embodiment of the present invention. As used herein, the term "routing matrix" refers to a plurality of connections for routing communications between components of the pattern-recognition processor 14. The "routing matrix" described below can be functionally distinct from the matrices described above in FIGS. 1-12. As described further below, the routing matrix can provide for programmable and/or non-programmable connections at, in, and between every level of the hierarchy of the pattern-recognition processor 14 described above. The connections may connect routing lines between feature cells, groups, rows, and blocks of the pattern-recognition processor 14. The connections may include, but are not limited to, the following types of connections: programmable and non-programmable; uni-directional and bi-directional; logical combinations (OR, AND, XOR, etc.); selectors (e.g., one of many); and isolators (break connections to a line). A programmable connection may be configured to perform any of the functionality listed above. For example, a programmable connection may be programmed as uni-directional, bi-directional, any logical combination, selector, isolator, etc. A non-programmable connection may perform any of the functionality described above, but is incapable of being programmed with a different functionality.

The connections in FIGS. 17-21 are depicted by connection symbols summarized below in Table 1:

TABLE 1

| Connections | |
| --- | --- |
| Symbol | Description |
| ● | Non-programmable "1$^{st}$ level" output connection |
| ○ | Programmable "1$^{st}$ level" input connection |
| □ | Programmable "2$^{nd}$ level" input connection |
| □ | Programmable "2$^{nd}$ level" output connection |

TABLE 1-continued

| Connections | |
| --- | --- |
| Symbol | Description |
| ▽ | Programmable "3$^{rd}$ level" connection |
| ⌷ | Programmable "4$^{th}$ level" connection |

Figure 17:
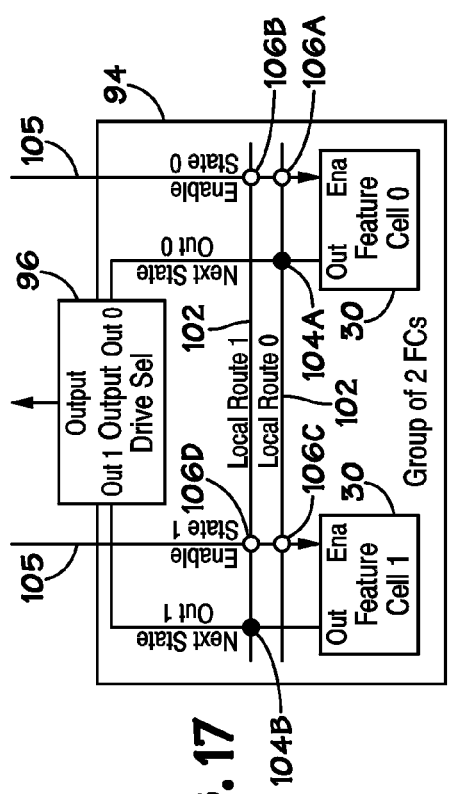
FIGS. 17-20 depict a multi-level hierarchical routing matrix of a pattern-recognition processor in accordance with an embodiment of the present invention.

FIG. 17 depicts a hierarchy level that includes the group 94 of feature cells 30 described above in FIG. 13 and in accordance with an embodiment of the present invention. As mentioned above, each feature cell 30 may receive an input that enables the feature cell as the next state. As also mentioned above, based on the pattern matching executed against the search criteria programmed in the feature cells 30, the feature cell 30 may generate an output that enables the next active state (next state signal).

The routing of the input and output signals of the feature cells 30 are determined by the connections. The feature cells 30 of the group 94 may be interconnected by local route lines 102 (Local Route 0 and Local Route 1). The outputs of the feature cells 30 of the group 94 are coupled to the local route lines 102 and the output drive select 96 by output connections 104. For example, Feature Cell 0 is coupled to Local Route Line 0 by a first output connection 104A and Feature Cell 1 is coupled to Local Route Line 1 by a second output connection 104B. As depicted in FIG. 17, in one embodiment, the output connections are non-programmable "1$^{st}$ Level" connections. In such an embodiment, the connections 104 are not removable and are not configurable. In other embodiments, the output connections 104 may be programmable.

The output drive select 96 may be programmed to drive any number or type of signals from the received outputs of the feature cells 30. As mentioned above, in one embodiment, the output drive select 96 may be configured to output one of three possible logical outputs: "Next State Out 0"; "Next State Out 1"; or the logical OR of the two Next State Out signals. In other embodiments, the output drive select 96 may be configured to output other logical combinations, such as AND, NOR and/or XOR.

The local route lines 102 may be coupled to the inputs 105 (which may represent one or more input signals) of the feature cells 30, by input connections 106. For example, the Feature Cell 0 may be coupled to Local Route Lines 0 and 1 by input connections 106A and 106B respectively. Similarly, Feature Cell 1 may be coupled to Local Route Line 0 and Local Route Line 1 by input connections 106C and 106D respectively. As depicted in FIG. 17, the input connections 106 may be programmable "1$^{st}$ Level" connections. In such an embodiment, the input connections 106 may be configured to provide a logical OR of any of the connected inputs 105.

Figure 18:
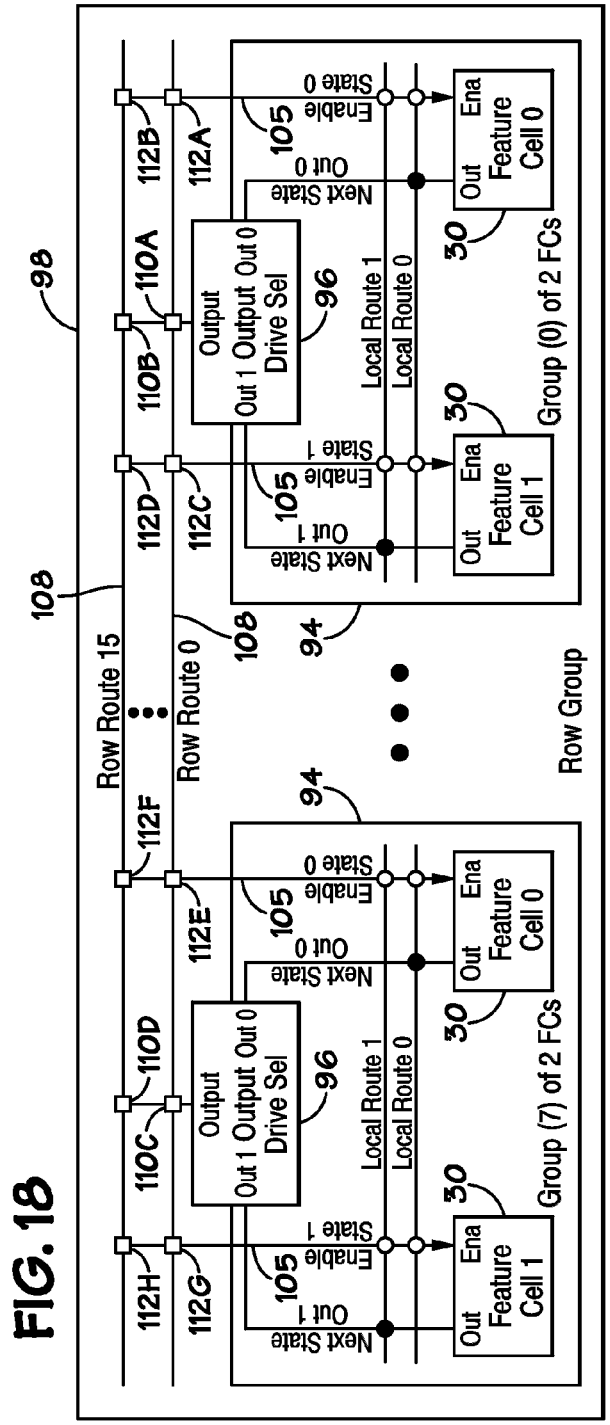

FIG. 18 depicts a hierarchy level having the row 98 of the groups 94 as described above in FIG. 14 and in accordance with an embodiment of the present invention. As mentioned above, each row 98 may include any number of groups 94 of feature cells 30, e.g., Group 0 through Group 7 shown in FIG. 18. The groups of the row 98 may be interconnected by row route lines 108. In one embodiment, row route lines 108 may be provided for each row of the block 100. Thus, in an embodiment having 16 rows 98 per block 100, 16 row route lines may be provided, e.g., Row Route line 0 through Row Route line 15.

The outputs from the output drive selects 96 of each group 94 may be coupled to each row route line 108 by output connections 110. In one embodiment, the output connections may be programmable "2$^{nd}$ level" connections. As shown in FIG. 18, for example, Group 0 may be coupled to the row route lines 0 and 15 by output connections 110A and 110B respectively. Group 7 may be coupled to the row route lines 0 and 15 by output connections 110C and 110D respectively. All other row route lines (not shown) may be coupled to the output drive selects of Groups 0 through Group 7 by output connections 110. The output connections 110 may be configured to enable the output drive select 96 of a group 94 to drive or not drive a particular row route line 108.

Figure 19:
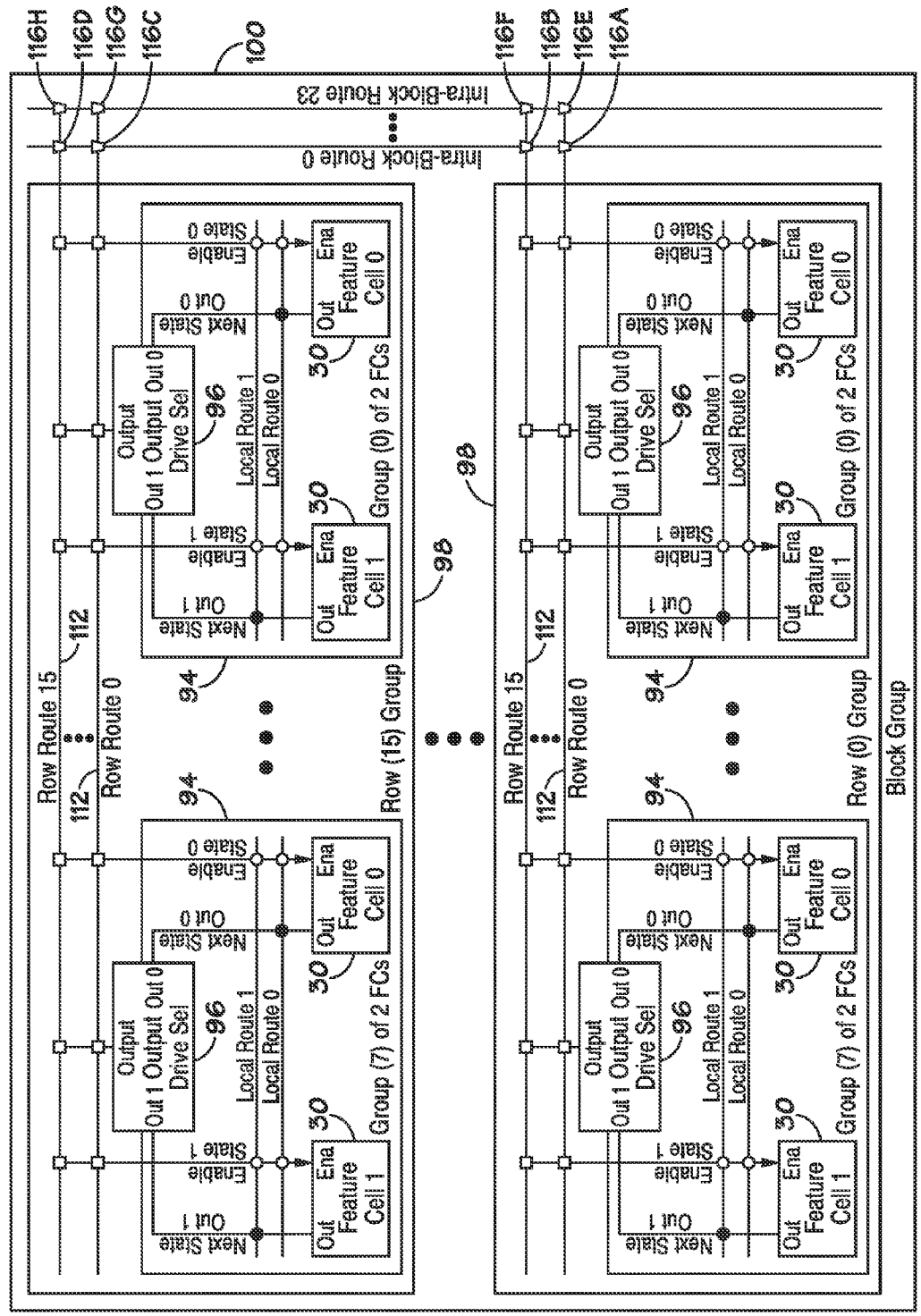

Additionally, the row route lines 108 may be coupled to the inputs 105 of each feature cell 30 by input connections 112. In one embodiment, the input connections 112 may be programmable "$2^{nd}$ level" connections. For example, the row route lines 108 may be coupled to the inputs of Feature Cell 0 of Group 0 by input connections 112A and 112B, and the row route lines 108 may be coupled to the inputs of Feature Cell 1 of Group 0 by input connections 112C and 112D. Similarly, as also shown in FIG. 18, the row route lines 108 may be coupled to the inputs of Feature Cell 0 of Group 7 by input connections 112E and 112F, and the row route lines 108 may be coupled to Feature Cell 1 of Group 7 by input connections 112G and 112H. Other row route lines (not shown) may be coupled to the inputs of each feature cell 30 of each group 94 of the row 98. In such an embodiment, the input connections 112 may be programmed to be a logical OR of any connected inputs to the feature cells 30. In other embodiments, the connections may be non-programmable and/or bi-directional connections Next, FIG. 19 depicts a hierarchy level of a block 100 having multiple rows 98 as described above in FIG. 15 and in accordance with an embodiment of the present invention. As described above, the block 100 may include any number of rows 98, e.g., Row 0 through Row 15. The rows 98 of the block 100 may be connected by intra-block route lines 114. The intra-block route lines 114 may be coupled to the row route lines 112 by bi-directional connections 116. In one embodiment, the bi-directional connections may be programmable "$3^{rd}$ level" connections. For example, intra-block line route line 0 may be coupled to Row Route line 0 of Row 0 by bi-directional connection 116A and Row Route line 15 of Row 0 by bi-directional connection 116B. Intra-block line route line 0 may be coupled to Row Route line 0 of Row 15 by bi-directional connections 116C and Row Route line 15 of Row 15 by bi-directional connection 116D. Similarly, intra-block route line 23 may be coupled to Row Route line 0 of Row 0 by bi-directional connection 116E and Row Route line 15 of Row 0 by bi-directional connection 116F. Further, as also shown in FIG. 19, intra-block route line 23 may be coupled to Row Route line 0 of Row 15 by bi-directional connections 116G and Row Route line 15 of Row 15 by bi-directional connection 116H. Other intra block lines (not shown) may be coupled to each row route line 116 of each row 98 by bi-directional connections 116.

As described above, the bi-directional connections 116 may be programmable. Thus, the bi-directional connections 116 may be programmed to enable one or more of the intra-block route lines 114 to drive a respective row route line 112 or to enable one or more row route lines 112 to drive a respective intra block route line 114. Each bi-directional connection 116 may be individually programmed, enabling configuration of connections between row route lines 112 and intra-block route lines 114 on a line-by-line basis. In other embodiments, the connections may be non-programmable and/or uni-directional connections.

Figure 20:
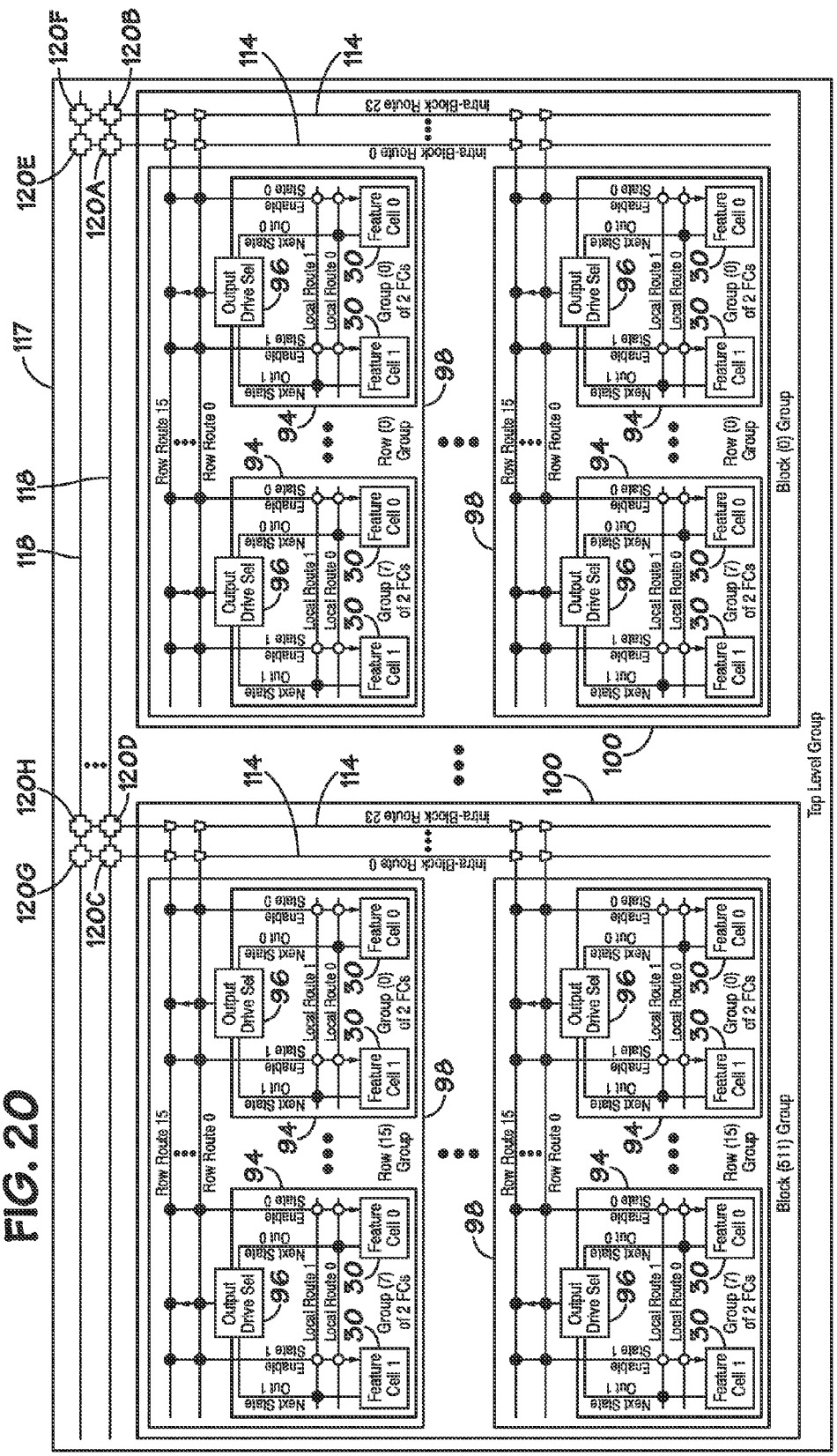

FIG. 20 depicts a top hierarchy level 117 of the routing matrix having blocks 100 in accordance with an embodiment of the present invention. In one embodiment, as shown in FIG. 20, the top level 117 may include 512 blocks 100, e.g., Block 0 through Block 511. The blocks 100 may be interconnected by top level route lines 118. The top level route lines 118 may be connected to the intra-block route lines 114 by bi-directional connections 120. Thus, as shown in FIG. 20, top level route line 0 may be coupled to intra-block route line 0 and intra-block route line 23 of Block 0 by bi-directional connections 120A and 120B respectively. Similarly, top level route line 0 may be coupled to intra-block line 0 and intra-block line 23 of Block 511 by bi-directional connections 120C and 120D respectively. As shown in FIG. 20, top level route line 23 may be coupled to intra-block route line 0 and intra-block route line 23 of Block 0 by bi-directional connections 120E and 120F respectively. Further, top level route line 23 may be coupled to intra-block line 0 and intra-block line 23 of Block 511 by bi-directional connections 120G and 120H respectively. All other top level route lines (not shown) may be coupled to the intra-block lines 114 of the blocks 100 by bi-directional connections 120.

As shown in FIG. 20, the bi-directional connections 120 may be programmable "$4^{th}$ level connections." The bi-directional connections may be programmed to enable one or more intra-block route lines 114 to drive a respective top level route line 118 or to enable one or more top level route lines 118 to drive a respective intra-block route line 114. Thus, the connections 120 may be programmed and configured on a line-by-line basis. In other embodiments, the connections may be non-programmable and/or uni-directional connections Advantageously, the multi-level hierarchical routing matrix described above may provide regularity of the programmability of the device, implementation of redundancy for improvements in production and manufacturing yields, changeability for different applications, and easier visualization and implementation of logic changes.

Figure 21:
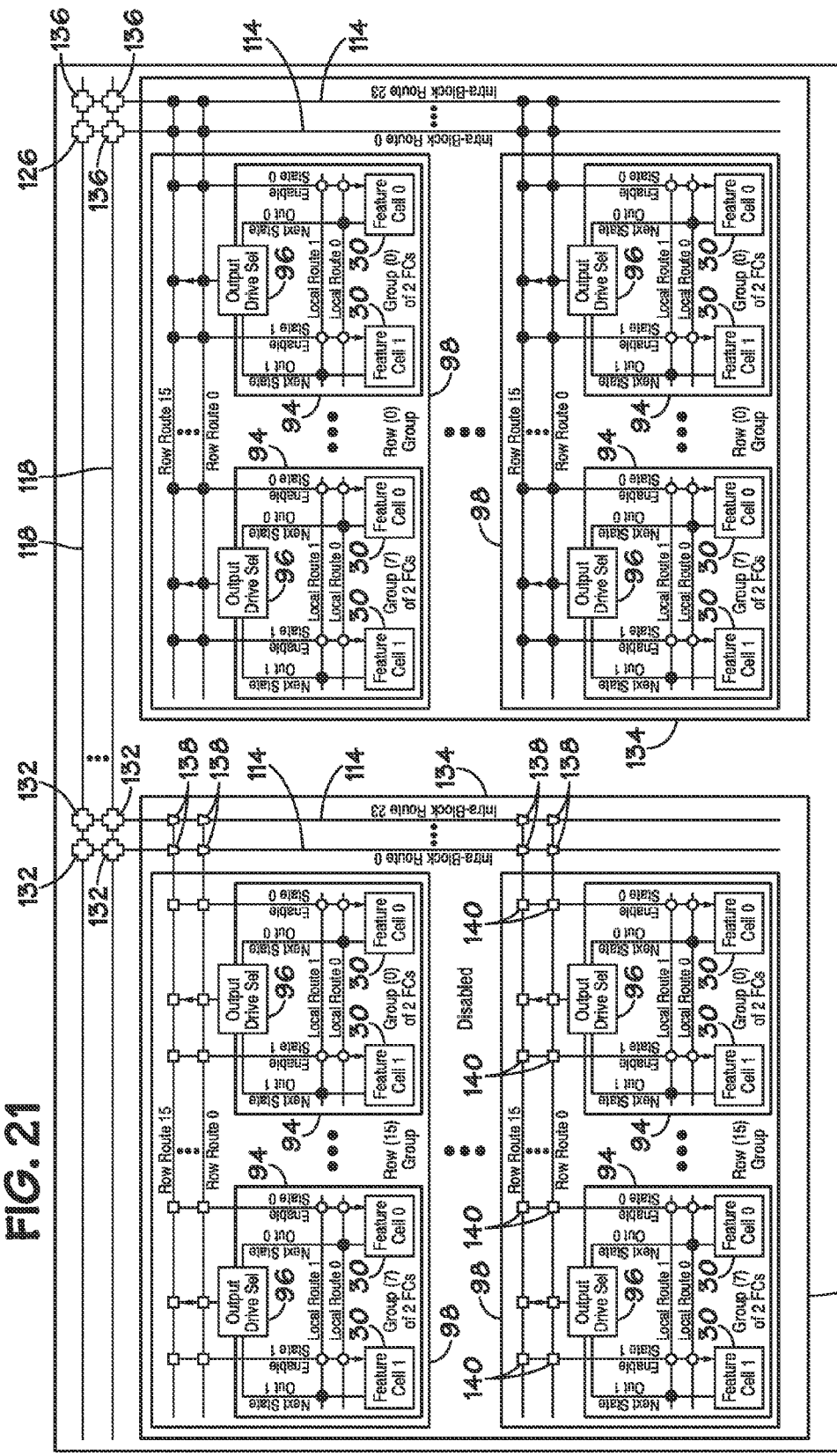
FIG. 21 depicts disabling of a portion of the feature cells of a pattern-recognition processor in accordance with an embodiment of the present invention.

As mentioned above, the connections may be isolators that are capable of "breaking" a line such that no signals are routed over a line, enabling a redundant section of the pattern-recognition processor 14 to be disabled. FIG. 21 depicts isolation of one or more feature cells 30 of the pattern-recognition processor 14 in accordance with an embodiment of the present invention. For example, the pattern-recognition processor 14 may include a block 130 of feature cells 30 that provide more capacity than used by the pattern-recognition processor 14. That is, during manufacture, to increase yields a pattern-recognition processor 14 may be manufactured with excess memory capacity (excess feature cells 30) than specified for the function of the processor 14. During manufacturing and testing of the processor 14, the excess feature cells 30 may be "disabled" by removing the feature cells available for the programmed state machines used by the processor 14. Some embodiments may not use all of the blocks of feature cells 30. In such embodiments, the unused blocks may be disabled. Disabled blocks may not be "activated" and/or "powered-up," and may not be refreshed during refresh cycles.

The block 130 may be coupled to the other portions of the pattern-recognition processor 14 by the connections 132 between the top level route lines and the intra-block route lines. In such an embodiment, the connections 132 may be programmable "$4^{th}$ level connections" that may be programmed to any desired functionality. Accordingly, if block 130 provides excess capacity, the connections 132 may be programmed to isolate block 130 from the rest of the route lines. Thus, the connection between the top level route lines 118 and the intra-block routing lines 114 may be "broken" by the programmable connections 132. Block 130 may be referred to as "disabled." In addition, unused block 130 may be "powered down," such as by setting an appropriate programming bit, in the block 130.

In contrast, other blocks that are used to provide memory capacity for programmed state machines of the pattern-recognition processor 14 may be accessible through the top level route lines 118 and intra-block route lines 114. For example, as shown in FIG. 21, block 134 is also connected to the same top level route lines 118 as disabled block 132, by connections 136. As shown in FIG. 21, the connections 136 may be programmable 4$^{th}$ level connections. However, the connections 136 may be programmed to enable access to the memory capacity provided by block 134, such as by allowing the top level route lines to drive the intra-block route lines or vice-versa. In other embodiments, feature cells 30 may be disabled at the row level, such as by programming the connections 138 between the intra-block route lines 114 and the row route lines 112, and/or at the group level, such as by programming the connections 140 between the row route lines 112 and the local route lines 102.

Further, in other embodiments, the multi-level hierarchical routing matrix described above may vary in levels, connections, etc., based on the pattern-matching functionality implemented in the pattern-recognition processor 14. For example, other embodiments may include a different number of levels in the hierarchy, and/or different number of connections between levels, groups, rows, and/or blocks. Additionally, other embodiments may include different programmable functions usable for the programmable connections, different types of connections and different points in the hierarchy, the ability to programmatically break connection lines into multiple lines, and the ability to add and/or delete different functionality at different levels in the hierarchy.

Figure 22:
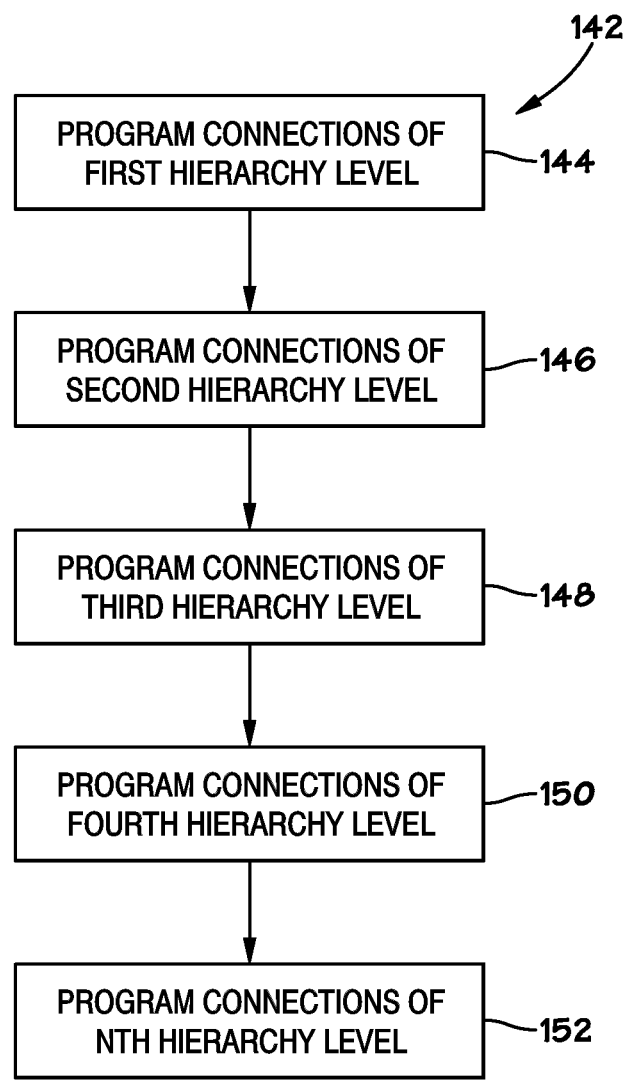
FIG. 22 is a flowchart of a process for programming the connections of a multi-level hierarchical routing matrix in accordance with an embodiment of the present invention.

FIG. 22 depicts a process 142 of configuration of the multi-level hierarchical routing matrix described above in accordance with an embodiment of the present invention. During configuration of the pattern-recognition processor 14, the connections at and between each level of the hierarchy may be programmed in any order. Further, such connections may be programmed manually or automatically based on the specific pattern-matching implementation desired in the pattern-recognition processor 14. It should also be appreciated that the programming of the connections at or between levels of the matrix may be dependent on the functionality programmed into other levels of the matrix. Initially, the connections at the first hierarchy level may be programmed (block 144). For example, this may include programming connections between the output of the feature cells 30 and the local route lines 102 and the inputs of the feature cells 30 and the local route lines 102, such as programming the connections 106 described above in FIG. 17. In some embodiments, the input and/or output connections from the feature cells 30 may be non-programmable connections and may not be programmed. For example, as also described above in FIG. 17, in one embodiment the output connections 104 may be non-programmable connections.

Next, the connections at a second level of the hierarchy may be programmed (block 146). In one embodiment such programming may include programming the input connections between the row route lines 108 and a group 94, as described above in FIG. 18. For example, the connections 112 between the input to the feature cells 30 and the row route lines 108 may be programmed to be a logical OR (or other function) of the inputs 105 to the feature cells 30. Similarly, the output connections 110 may be programmed to provide the desired functionality between the row route lines and the output drive selects 96 of the groups 94.

Additionally, the connections at a third level of the hierarchical routing matrix may be programmed (block 148). As discussed above in FIG. 19, in one embodiment the connections 116 between the row route lines 112 and the intra-block route lines 114 may be programmed. For example, the connections 116 may be programmed to provide the desired functionality between the intra-block route lines 114 and the row route lines 112, to isolate (disable) certain feature cells, or any other programmable function.

Next, the connections at a fourth hierarchy level may be programmed (block 150). In the embodiment depicted above in FIG. 20, such programming may include programming the connections between the intra-block route lines 114 and the top level route lines 118. For example, the connections 120 shown above in FIG. 20 may be programmed to provide the desired functionality between the top level route lines 118 and the intra-block route lines 114. As also discussed above in FIG. 21, in some embodiments, such programming may include disabling redundant capacity (e.g., feature cells) of the pattern-recognition processor 14. As shown in FIG. 22, such programming of the connections may continue up to the nth level of the routing matrix (block 152). By programming the connections of the routing matrix, the pattern-recognition processor 14 may be configured to provide the desired logic and next state routing between feature cells (and state machines). As mentioned above, the programming of the connections provides knowledge of the configuration of the pattern-recognition processor 14 yet also provides routing flexibility and changeability for different implementations.

What is claimed is:

1. A device, comprising:
   pattern-recognition processor, comprising:
   a plurality of logical groups, wherein each group comprises first route lines, a first feature cell, and a second feature cell, wherein each of the first and the second feature cells of each group comprises an enable input and an enable output, wherein the first and the second feature cells of each group are selectively coupled to the first route lines by first connections, and wherein the first connections comprise enable input connections that couple the enable input of the first and the second feature cells to the first route lines and enable output connections that couple the enable output of the first and the second feature cells to the first route lines, wherein a given feature cell of a given group is configured to transmit a state output signal from the enable output of the given feature cell to an enable input of another feature cell of the given group along one of the first route lines, wherein the first feature cell and the second feature cell of each group of the plurality of logical groups are separate and distinct from feature cells of any other group of the plurality of logical groups;
   a plurality of logical rows, wherein each row comprises one or more of the plurality of groups, wherein the one or more groups of each row are coupled to second route lines by second connections, wherein the second route lines are selectively coupled to the enable inputs of each of the first and the second feature cells of each group by the second connections, wherein the given group is configured to transmit a second state output signal generated by the given feature cell, the another feature cell, or a combination thereof to a first feature cell of a second group along the second route lines, wherein the first route lines are distinct route lines separate from the second route lines; and
   a plurality of logical blocks, wherein each block comprises one or more of the plurality of rows, wherein the one or more rows of each block are coupled to third route lines by third connections, wherein a given row is configured to transmit the second state output signal to a first feature cell of a third group of a second row along the third route lines;

wherein the plurality of blocks are coupled to fourth route lines by fourth connections, wherein a given block is configured to transmit the second state output signal to a first feature cell of a fourth group of a second block along the fourth route lines.

2. The device of claim 1, where each group of the plurality of groups further comprises an output drive selector coupled to the first and the second feature cells of a respective group.

3. The device of claim 2, wherein the output drive selector is configured to provide an output based on the outputs of the first and the second feature cells of the respective group.

4. The device of claim 2, wherein the output drive selector is configured to selectively output an output of the first feature cell or the second feature cell of the respective group or a logical combination of the outputs of the first and the second feature cells of the respective group as the second state output signal.

5. The device of claim 2, wherein each of the first and the second feature cells of each group is coupled to a respective output drive selector by a non-programmable connection.

6. The device of claim 1, wherein each of the plurality of groups comprises only two feature cells.

7. The device of claim 1, wherein the first and the second feature cells of each group are each configured to receive one or more inputs and output a next state signal as the second state output signal.

8. The device of claim 7, wherein the first connections comprise first programmable connections.

9. The device of claim 8, wherein the first programmable connections are configured to provide a logical combination of the one or more inputs of a respective one of the first feature cell or the second feature cell of each group.

10. The device of claim 2, wherein the output drive selector of each group is coupled to the second route lines by respective ones of the second connections, wherein the respective ones of the second connections comprise programmable connections.

11. The device of claim 1, wherein the first and the second feature cells of each group are each coupled to the second route lines by programmable connections.

12. The device of claim 1, wherein the rows of each block are each coupled to the third route lines by programmable connections.

13. The device of claim 1, wherein the fourth connections are programmable connections.

14. A device comprising:
a pattern-recognition processor, comprising:
a hierarchical routing matrix, the matrix comprising:
a first level comprising a first feature cell and a second feature cell, wherein each of the first and the second feature cells comprises an enable input and an enable output, wherein each of the first and the second feature cells are coupled to one or more first programmable connections via the enable input of each of the first and the second feature cells, wherein the first feature cell is configured to transmit a state output signal from the enable output of the first feature cell to an enable input of the second feature cell along first route tines;
a second level comprising groups of feature cells of the first level, wherein the groups of feature cells are coupled to one or more row route lines via one or more second programmable connections, wherein the one or more row route lines are selectively coupled to the enable inputs of each of the first and the second feature cells by the one or more second connections, wherein a first group of the groups is configured to transmit a second state output signal generated by the first feature cell, the second feature cell, or a combination thereof to a first feature cell of a second group of the groups of feature cells along the one or more row route lines, wherein the first feature cell and the second feature cell of each group of the groups of feature cells are unique to a single group of the groups feature cells, wherein the first route lines are unique route lines separate from the one or more row route lines;
a third level comprising one or more rows of the groups of feature cells, wherein the rows are coupled to one or more third programmable connections, wherein a given row of the one or more rows of groups is configured to transmit the second state output signal to a first feature cell of a second row along intra-block route lines; and
a fourth level comprising one or more blocks of the one or more rows, wherein the blocks are coupled to one or more fourth programmable connections, wherein a given block of the one or more blocks is configured to transmit the second state output signal to a first feature cell of a second block of the one or more blocks along top level route lines.

15. The device of claim 14, wherein the hierarchical routing matrix is configured to provide next state routing between the groups of feature cells.

16. The device of claim 14, wherein the first and the second feature cells of each group are coupled to one or more respective non-programmable connections.

17. The device of claim 16, wherein each of the groups comprises an output coupled to the first and second feature cells therein by the respective one or more non-programmable connections.

18. The device of claim 16 wherein a respective one of the one or more second programmable connections is configured to enable an output of a respective one of the groups of feature cells to drive or not drive a given row route line.

19. The device of claim 16, wherein a respective one of the one or more third programmable connections is configured to enable a given row route line to drive a given intra-block route line or the given intra block route line to drive the given row route line.

20. The device of claim 16, wherein a respective one of the fourth programmable connections is configured to enable a given intra-block route line to drive a given top level route line or the given top level route line to drive the given intra-block route line.

21. A pattern-recognition processor, comprising:
a plurality of route lines, wherein the plurality of route lines are configured to route between feature cells of groups of feature cells of the processor, wherein each feature cell of the groups of feature cells comprises an enable input for enabling the feature cell, and an enable output for enabling another feature cell of the groups of feature cells;
a plurality of programmable connections coupled to a first one or more of the plurality of route lines; and
a plurality of non-programmable connections coupled to a second one or more of the plurality of route lines, wherein a given feature cell of a given group of the groups of feature cells is configured to transmit a state output signal from the enable output of the given feature cell to an enable input of a second feature cell of the given group along the first route lines, wherein the given group is configured to transmit a second state output signal generated by the given feature cell, the second feature cell, or a combination thereof to a first feature cell of a second group of the groups of feature cells along a row route line, wherein the given feature cell and the second feature cell of the given group are distinct feature cells separate from any feature cells of any other group of the groups of feature cells, wherein the first route lines are distinct route lines separate from the row route line.

22. The pattern-recognition processor of claim 21, wherein one or more of the plurality of programmable connections comprise uni-directional or bi-directional connections.

23. The pattern-recognition processor of claim 21, wherein one or more of the plurality of programmable connections are configured to provide uni-directional or bi-directional connections.

24. The pattern-recognition processor of claim 21, wherein one or more of the plurality of programmable connections are configured to provide a logical OR, a logical AND, or a logical XOR.

25. The pattern-recognition processor of claim 21, wherein one or more of the plurality of programmable connections are configured to provide a selector.

26. The pattern-recognition processor of claim 21, wherein one or more of the plurality of programmable connections are configured to provide an isolator.

27. A method, comprising:
programming one or more first programmable connections of a plurality of routing connections of a pattern-recognition processor, wherein the first programmable connections are coupled to a first level comprising one or more feature cells interconnected via one or more local routing lines, wherein each feature cell of the one or more feature cells comprises an enable input and an enable output for enabling another feature cell of the one or more feature cells, wherein a given feature cell of a given group of the first level is configured to transmit a state output signal from the enable output of the given feature cell to an enable input of a second feature cell of the given group along the local routing lines; and
programming one or more second programmable connections of the plurality of routing connections of the pattern-recognition processor, wherein the second programmable connections are coupled to a second level comprising one or more groups of the one or more feature cells, wherein the given group of the one or more groups is configured to transmit a second state output signal via an output drive selector of the given group coupled to each of the given feature cell and the second feature cell, wherein the output drive selector is configured to generate the second state output signal based upon a received output from the given feature cell, based upon a received output from the second feature cell, or based upon a combination thereof, and wherein the output drive selector is configured to transmit the second state output signal to a first feature cell of a second group of the one or more groups along second route lines.

28. The method of claim 27, further comprising programming one or more third programmable connections of the plurality of routing connections of the pattern-recognition processor, wherein the third programmable connections are coupled to a third level comprising one or more rows of the one or more groups, wherein a given row of the one or more rows is configured to transmit the second state output signal to a second row of the one or more rows along third routing lines.

29. The method of claim 28, further comprising programming one or more fourth programmable connections of the plurality of routing connections of the pattern-recognition processor, wherein the fourth programmable connections are coupled to a fourth level comprising one or more blocks of the one or more rows, wherein a given block of the one or more blocks is configured to transmit the second state output signal to a second block of the one or more blocks rows along fourth routing lines.

30. The method of claim 29, further comprising programming the first programmable connections, second programmable connections, third programmable connections, or fourth programmable connections or any combination thereof to disable one or more feature cells of the pattern-recognition processor.

31. A system, comprising:
a routing matrix for a pattern-recognition processor, the matrix comprising:
a plurality of programmable connections between two or more components of the pattern-recognition processor; and
a plurality of non-programmable connections between two or more components of the pattern-recognition processor, wherein the two or more components comprise feature cells configured to each search at least a portion of a data stream, logical arrangements of the feature cells, and/or any combination thereof, and wherein each feature cell of the feature cells comprises an enable input for enabling the feature cell, and an enable output for enabling another feature cell, wherein a given feature cell of a given group comprising the two or more components is configured to transmit a state output signal from the enable output of the given feature cell to an enable input of a second feature cell of the given group along local routing lines, wherein the given group is configured to transmit a second state output signal via an output drive selector of the given group coupled to each of the given feature cell and the second feature cell, wherein the output drive selector is configured to generate the second state output signal based upon a received output from the given feature cell, based upon a received output from the second feature cell, or based upon a combination thereof, and wherein the output drive selector is configured to transmit the second state output signal to a first feature cell of a second group of one or more groups along row route lines.

* * * * *